United States Patent
Nakano et al.

(10) Patent No.: US 6,712,928 B2
(45) Date of Patent: Mar. 30, 2004

(54) METHOD AND ITS APPARATUS FOR DETECTING FLOATING PARTICLES IN A PLASMA PROCESSING CHAMBER AND AN APPARATUS FOR PROCESSING A SEMICONDUCTOR DEVICE

(75) Inventors: Hiroyuki Nakano, Yokohama (JP); Toshihiko Nakata, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 142 days.

(21) Appl. No.: 09/791,677

(22) Filed: Feb. 26, 2001

(65) Prior Publication Data

US 2002/0016068 A1 Feb. 7, 2002

(30) Foreign Application Priority Data

Aug. 7, 2000 (JP) ......................................... 2000-244012

(51) Int. Cl.[7] ............................. H05H 1/00; C23C 16/00
(52) U.S. Cl. ......................... 156/345.24; 156/345.25; 118/715; 118/712
(58) Field of Search ..................... 156/345.24, 345.25; 118/715, 712; 204/298.03, 298.32, 192.13, 192.33; 356/947, 948, 949, 337

(56) References Cited

U.S. PATENT DOCUMENTS

| | | | |
|---|---|---|---|
| 4,669,876 A | * | 6/1987 | Dopheide .................. 356/28.5 |
| 5,255,089 A | | 10/1993 | Dybas et al. |
| 5,367,139 A | | 11/1994 | Bennett et al. |
| 6,042,650 A | * | 3/2000 | Uesuge et al. .............. 118/712 |
| 6,125,789 A | * | 10/2000 | Gupta et al. ............. 118/723 E |

FOREIGN PATENT DOCUMENTS

| | | |
|---|---|---|
| JP | 57-118630 | 7/1982 |
| JP | 3-25355 | 2/1991 |
| JP | 3-147317 | 6/1991 |
| JP | 6-82358 | 3/1994 |
| JP | 06-124902 | 5/1994 |
| JP | 09-24359 | 1/1997 |
| JP | 10-213539 | 8/1998 |
| JP | 11-251252 | 9/1999 |
| JP | 11-330053 | 11/1999 |
| JP | 2000-208448 | 7/2000 |

\* cited by examiner

*Primary Examiner*—Parviz Hassanzadeh
(74) *Attorney, Agent, or Firm*—Antonelli, Terry, Stout & Kraus, LLP

(57) ABSTRACT

The following operations are performed in order to allow particles suspended in a processing chamber to be detected using a single observation window and an optical system formed as a single unit and in order to provide precise detection of very weak particle-scattered light: when a desired film-forming/processing operation is being performed on a body being processed in a processing chamber, a beam that is P-polarized and that is intensity amplified at a frequency different from an excitation source frequency and integer multiples thereof is passed through an observation window sloped to form a Brewster angle relative to the P-polarized entry beam; back-scattered light scattered by particles in the processing chamber passes through the same observation window and received and imaged by a detection optical system; the frequency component described above and the intensity-modulated beam wavelength component are detected from the received light signal; and these detected components and the image information imaged as described above is used to determine the quantity, sizes, and distribution of the particles.

26 Claims, 15 Drawing Sheets

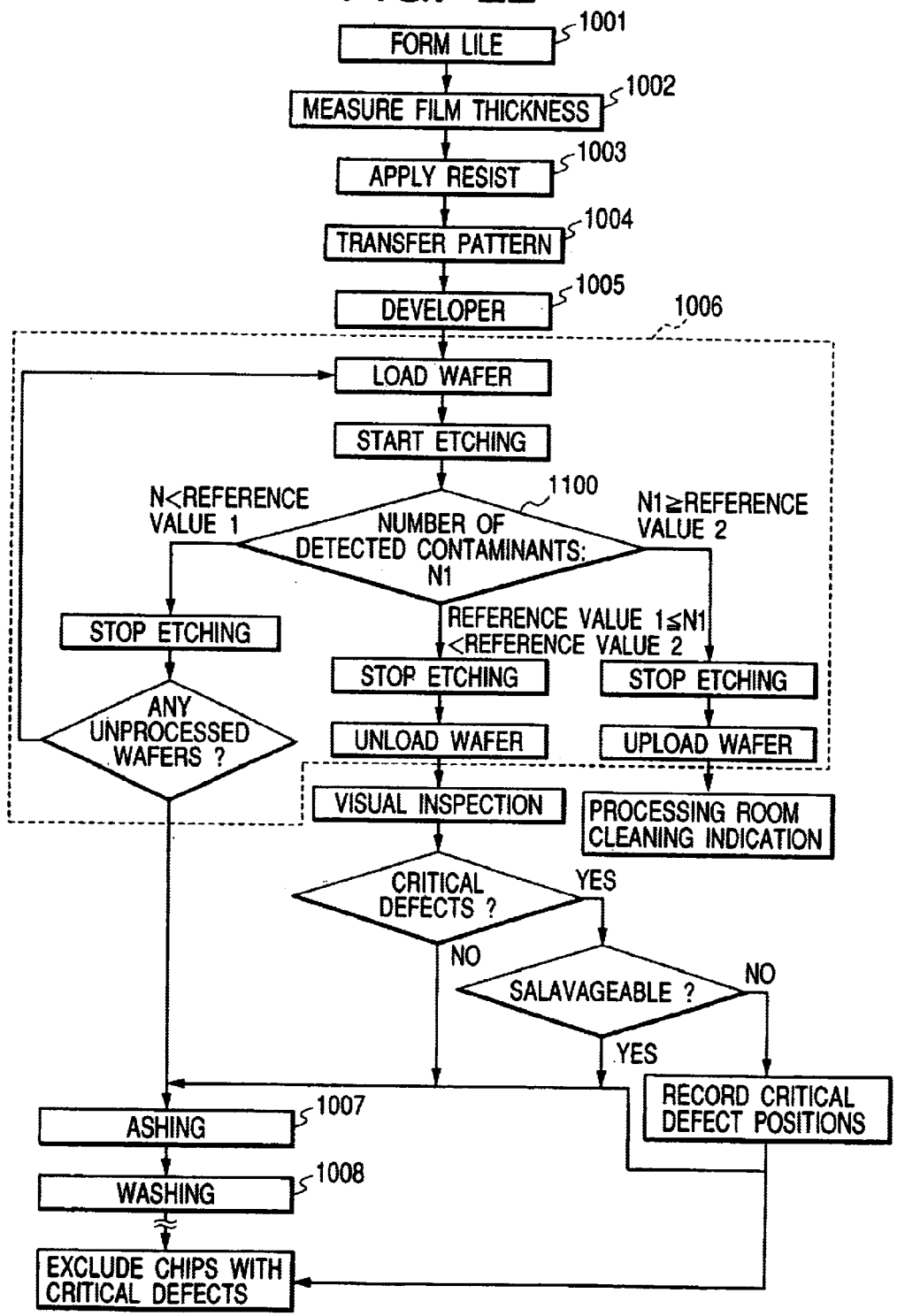

METHOD AND ITS APPARATUS FOR DETECTING FLOATING PARTICLES IN A PLASMA PROCESSING CHAMBER AND AN APPARATUS FOR PROCESSING A SEMICONDUCTOR DEVICE

BACKGROUND OF THE INVENTION

The present invention relates to a method and device for detecting fine particles (contaminants) suspended in a processing chamber of a processing device for semiconductor devices for forming desired films, circuit patterns, and the like on a semiconductor substrate using plasma through etching, sputtering, CVD, or the like. The present invention also relates to a device for processing semiconductor devices equipped with a function for measuring, in real time during processing, particles generated in the processing chamber when films, circuit patterns, and the like are being formed with a plasma processing technology.

Processes using plasma are widely used in semiconductor device processing (production) processes and liquid crystal display device substrate processing (production) processes, e.g., in etching devices.

FIG. 25 shows an example of a processing device that uses plasma in the form of a parallel flat plasma etching device. As shown in FIG. 25, this type of device uses a high-frequency signal from a signal generator 83 to modulate the output potential from a power amp 84. This high-frequency potential is split up using a distributor 85 applied to an upper electrode 81 and a lower electrode 82 disposed parallel to each other in a processing chamber 86. Discharge between the two electrodes 81, 82 generates a plasma 71 from an etching gas. Etching is performed on the workpiece, e.g., a semiconductor substrate (wafer) W.

The high-frequency signal is a signal with a frequency of, for example, 400 kHz. In the etching operation, the progress of etching is monitored and the timing at which to stop etching is detected as accurately as possible so that etching is performed for a predetermined pattern and depth. When the stopping timing is detected, the output from the power amp 84 is stopped and the semiconductor wafer W is ejected from the plasma processing chamber 86.

In this plasma etching device, it is known that the etching reaction product from the plasma operation is deposited on the wall surface of the plasma processing chamber or the electrodes. As time goes by, the product peels off and forms suspended fine particles. As soon as the etching operation is completed and the plasma discharge stops, these suspended fine particles drop onto the wafer to form adhesed particles, leading to negative circuit properties and visual pattern defects. Ultimately, these can lead to reduced yield and reduced reliability of the elements.

Many types of devices for inspecting particles adhered to the surface of the wafer have been proposed and implemented, but these remove the wafer from the plasma processing device to perform inspection. By the time it is known that many particles are present, the processing of another wafer is already begun. This leads to clusters of defects and reduced yield. Also, evaluations performed after processing cannot determine distribution or changes over time in particles inside the processing.

Thus, there is a need in the field of semiconductor fabrication, liquid crystal fabrication, and the like of a technology for performing in-situ real-time monitoring of contamination status in processing chambers.

The sizes of fine particles suspended in the processing chamber range from submicrons to several hundred microns. In the semiconductor field, where integration scale is growing to include 256 Mbit DRAMs (Dynamic Random Access Memory) and 1 Gbit DRAMs, the minimum circuit pattern widths is decreasing to 0.25–0.18 microns. Thus, there is a need to detect sizes of particles down to the order of submicrons.

Conventional technologies for monitoring fine particles suspended in processing chambers (vacuum processing chambers) such as plasma processing chambers include Japanese laid-open patent publication number 57-118630 (background technology 1), Japanese laid-open patent publication number 3-25355 (background technology 2), Japanese laid-open patent publication number 3-147317 (background technology 3), Japanese laid-open patent publication number 6-82358 (background technology 4), Japanese laid-open patent publication number 6-124902 (background technology 5), and Japanese laid-open patent publication number Hei 10-213539 (background technology 6).

The background technology 1 discloses a vaporization device equipped with: means for illuminating a reaction space with a parallel light having a spectrum different from the spectrum of self-emitted light of the reaction space; and means for receiving parallel light illumination and detecting light scattered by fine particles generated in the reaction space.

The background technology 2 discloses a device for measuring fine particles that uses scattering of laser light to measure fine particles adhesed to a semiconductor device substrate surface and suspended fine particles. The device for measuring fine particles is equipped with a laser light phase modulator generating two laser lights modulated at predetermined frequencies having identical wavelengths and mutual phase differences; an optical system intersecting the two laser lights in a space containing the fine particles to be measured; an optical detection system receiving light scattered by the fine particles to be measured in the region where the two laser lights intersect and converting the light into an electrical signal; and a signal processor extracting a signal component from the electrical signal generated by the scattered light where the frequency is identical or twice the frequency of a phase modulation signal from the laser light phase modulator and the phase difference with the phase modulation signal is constant in time.

The background technology 3 discloses a technology for measuring contamination status in a reaction container that includes a step for performing scanning illumination with coherent light and generating scattered light in the reaction container and a step for detecting the scattered light in the reaction container. The scattered light is analyzed to measure the contamination status.

The background technology 4 discloses a particle detector equipped with: laser means generating a laser light; scanner means using the laser light to scan a region in a reaction chamber of a plasma processing tool containing particles to be measured; a video camera generating a video signal of laser light scattered by particles in the region; and means for processing and displaying an image from the video signal.

The background technology 5 discloses a plasma processing device equipped with: a camera device observing a plasma generating region in a plasma processing chamber; a data processing module processing an image obtained from the camera device to obtain desired information; and a control module controlling at least one of the following list to reduce particles based on information obtained by the data processing module: evacuating means; process gas introducing means; high-frequency potential applying means; and purge gas introducing means.

The background technology 6 discloses a fine particle sensor including: a light emitter sending out a light beam illuminating a space to be measured; a detector containing an optical detector and an optical system focusing the scattered light from the space to be measured and directing it to the optical detector, the being set up so that the optical detector generates a signal representing the intensity of the light directed toward the optical detector; a pulse detector connected to the optical detector to analyze the signal from the optical detector, and detecting pulses in the signal from the optical detector; and signal processing means containing an event detector detecting a series of pulses resulting from scattered light generated by fine particles accompanying multiple illuminations by the beam while it moves in the measurement space.

In the conventional technologies described above, a laser light is sent in through an observation window disposed on a side surface of a processing device. A different observation window from the laser entry observation window is disposed on the facing surface or another side surface to allow detection of front-scattering or side-scattering of the laser. Thus, in these systems for detecting front-scattered light and side-scattered light, the illumination optical system and the detection optical system are formed as different units and two observation windows 10a as shown in FIG. 25, for example, are needed to attach these. Also, optical axis adjustments and the like need to be performed for both the illumination and detection optical systems, making operation difficult.

Also, an observation window is almost always disposed on the side surface of a plasma processing chamber to allow monitoring of plasma emission and the like, but in many cases only one observation window is provided. Thus, the conventional methods that require two observation windows cannot be implemented for fabrication devices with a processing chamber that only has one observation window.

Furthermore, in conventional systems that detect front-scattered light and side-scattered light, the illumination beam sent into the processing chamber is rotationally scanned. Observation of fine particle generation over the entire surface of the workpiece such as a wafer requires multiple observation windows and detection optical systems, leading to significant cost increases. Also, providing multiple observation windows and detection optical systems is extremely difficult practically due to space factor restrictions.

Also, in the methods from the conventional technologies described above, a fixed laser light is used to measure a partial region of the wafer, and measuring particles suspended in plasma over the entire surface of the wafer is difficult.

Semiconductor production methods and devices equipped with a function for performing in-situ measurements of particles suspended in a plasma processing chamber over the entire surface of a wafer have been proposed. For example, there is Japanese laid-open patent publication number Hei 9-24359 (background technology 7).

The background technology 7 describes a method for monitoring particles in which a laser light is illuminated in the processing chamber vertically or horizontally or both vertically and horizontally. Laser light scattered by particles in the processing chamber is detected, and particles in the processing chamber are monitored in real time based on the intensity of the detected laser light.

However, in all of these systems, the laser illumination optical system and the scattered light detection optical system are formed separately. For this reason, only devices having at least two observation windows for illuminating the processing chamber with the laser light and detecting the scattered light can be used. In addition, the optical axes of the laser illumination optical system and the scattered light detection optical system must be adjusted separately, making them difficult to use. Japanese laid-open patent publication number Hei 11-251252 (background technology 8) presents a semiconductor production method and device equipped with a function for performing in-situ measurements of particles suspended in a plasma processing chamber over the entire surface of a wafer. A laser beam that is intensity modulated at a frequency different from the plasma excitation frequency is used to illuminate the inside of the plasma processing chamber through an observation window on the plasma processing chamber. Back-scattered light from particles is detected to detect suspended particles.

However, the background technology does not attempt to make the laser light source compact and easy to use.

Eliminating the influence of light reflected from the inner wall surfaces of the processing chamber is one of the issues involved in methods involving detection of back-scattered light. However, the background technology 8 does not take measures to deal with this issue.

In the semiconductor field, where integration is proceeding to the levels of 256 Mbit DRAMs and 1 Gbit DRAMs, the minimum circuit pattern width is being reduced down to 0.25–0.18 microns, creating the need to detect particles with sizes on the order of submicrons. However, with the conventional technologies, separating light scattered by fine particles from plasma emission is difficult, so these technologies have been restricted to use in measuring relatively large fine particles, while detection of fine particles with sizes on the order of submicrons is difficult.

In integrating the laser illumination optical system and the scattered light detection optical system to provide a particle monitor that can be attached to a single observation window, one effective method is to have the laser light propagate backward along the same axis as the illumination laser light so that it returns to the laser illumination optical system and allows back-scattered light to be detected.

Furthermore, making the individual elements used in the monitor more compact is important in providing a compact monitor.

Laser light sources are generally large compared to other optical elements. Also, optical elements tend not to break as long as external physical force is not applied, debris adhesed to the surface is not burnt by the laser light, or the like. Compared to this, laser light sources have short lifespans. Thus, compact and long-lasting semiconductor lasers and solid-state lasers excited by a semiconductor laser are effective for use as laser light sources in in-situ monitors. For uniform particle diameters, the intensity of scattered light generated by particles is proportional to the illumination laser light output and proportional to the square of the wavelength. Thus, compared to semiconductor lasers, solid-state lasers excited by a semiconductor laser in which the wavelength is shortened by non-linear optical crystals is more useful for particle detection through laser scattering.

However, the output and wavelength of semiconductor lasers vary according to changes in the atmospheric temperature and the temperature of the semiconductor crystals, thus requiring temperature control. As higher outputs are used, the amount of generated heat increases, requiring the generated heat to be dissipated externally. Cooling is generally provided through Peltier elements as well as heat-dissipating heat sinks. Compared to the small size of semiconductor lasers, these heat sinks have volumes that are greater by factors of less than ten to several dozen. Based on this, realization of a compact monitor requires a compact laser light source, including the heat sink.

One possible method is to have the laser light source installed externally, with the laser being guided by an optical fiber. Polarizing separation is a useful method for separating the illumination light and the scattered light propagating along the same optical axis, and polarized laser light can be guided by a polarization plane retention fiber. However, with high outputs, the use of thin, core-based polarization plane retention fibers can lead to damage to the entry end surface, leading to an increase in coupling loss. Furthermore, if the laser output is too high, the light can actually be reflected by the fiber rather than entering it. It is possible to increase the beam diameter and guide the beam through a fiber bundle in which multiple fibers are bundled together. However, to retain the polarization plane, the directions of all the individual fiber must be uniform, making this method difficult to implement.

SUMMARY OF THE INVENTION

The object of the present invention is to overcome the problems described above and to provide a suspended particle detection device: that integrates a laser illumination optical system and a scattered light detection optical system; that can be attached to a single observation window; that is compact and allows easy optical axis adjustment and the like; and that is equipped with a function for performing in-situ measurements of particles suspended inside a semiconductor production device during semiconductor processing without affecting the processing using a particle monitor that is easily maintained.

In the present invention, an illumination optical system and a detection optical system share the use of a single observation window. An optical system formed as a single unit detects particles suspended inside a processing chamber. Also, the present invention provides a method and device for forming a compact illumination/detection optical system that can be attached in a limited, small space. Also, the present invention provides a highly reliable method and device for precisely detecting very weak particle-scattered light. Also, the present invention provides a method and device for determining particle generation over the entire surface of a body being processed, e.g., a wafer. Also, the present invention provides a processing device for semiconductor devices that includes the above features.

In the present invention, a device for detecting particles suspended in a semiconductor production device includes: a laser light source module; a laser illumination optical system receiving a laser emitted by the laser light source and illuminating a laser inside the semiconductor production device; a scattered light detection optical system detecting a laser scattered by a particle suspended inside the semiconductor production device and illuminated by the scanning performed by the laser illumination optical system; and a signal processing/control module. The laser light source module and the laser illumination optical system are connected by an optical fiber.

According to another aspect of the present invention, a device for detecting particles suspended in a semiconductor production device includes: a laser light source module; a monitoring optical system using output from the laser light source module to illuminate inside the semiconductor production device and detect laser light scattered by a particle suspended inside the semiconductor production device; and a signal processing/control module processing a detection signal from the monitoring optical system. The monitoring optical system is connected to the laser light source module and the signal processing module by optical fibers.

According to another aspect of the present invention, when a desired film-forming/processing operation is being performed on an object being processed in a processing chamber, a laser light guided by an optical fiber from an external laser light source is passed through an observation window and illuminates the inside of the processing chamber. Back-scattered light scattered by particles in the processing chamber passes through the same observation window and is received by a detection optical system. This detection signal is used to determine the quantity, sizes, and distribution of the particles. The results of this are displayed on a display.

According to another aspect of the present invention, the illumination beam illuminating inside the processing chamber through the observation window is rotationally scanned horizontally so that a two-dimensional distribution of particles is determined.

According to another aspect of the present invention, a device for processing semiconductor devices includes: a processing chamber including a window allowing observation inside, a mounting module for mounting a substrate to be processed, and a pressure setting module maintaining a predetermined pressure inside; means for processing plasma generating plasma inside the processing chamber in which the predetermined pressure is maintained and processing the substrate to be processed mounted on the mounting module; a laser light source module disposed outside of the processing chamber; a laser illumination optical system receiving a laser emitted by the laser light source by way of an optical fiber and scanning a laser through the window to illuminate inside the device for processing semiconductor devices; a scattered light detection optical system detecting, through the observation window, scattered light scattered by a particle suspended inside the processing chamber and illuminated by the scanning performed by the laser illumination optical system while the plasma processing means is processing the substrate to be processed; and a signal processing module receiving, by way of an optical fiber, and processing a detection signal from the scattered light detection optical system and outputting information relating to the particle suspended in the device for processing semiconductor devices.

According to another aspect of the present invention, a device for processing semiconductor devices includes; a processing chamber including a window allowing observation inside, a mounting module for mounting a substrate to be processed, and a pressure setting module maintaining a predetermined pressure inside; means for processing plasma generating plasma inside the processing chamber in which the predetermined pressure is maintained and processing the substrate to be processed mounted on the mounting module; a laser light source module disposed outside of the processing chamber; a laser illumination optical system receiving a laser emitted by the laser light source by way of an optical fiber and scanning a laser through the window to illuminate inside the device for processing semiconductor devices; a scattered light detection optical system detecting, through the observation window, scattered light scattered by a particle suspended inside the processing chamber and illuminated by the scanning performed by the laser illumination optical system while the plasma processing means is processing the substrate to be processed; and a signal processing module receiving, by way of an optical fiber, and processing a detection signal from the scattered light detection optical system and outputting information relating to the particle suspended inside the processing chamber for processing semiconductor devices.

According to another aspect of the present invention, a device for processing semiconductor devices includes: a processing chamber including a window allowing observation inside, a mounting module for mounting a substrate to be processed, and a pressure setting module maintaining a predetermined pressure inside; means for processing plasma generating plasma inside the processing chamber in which the predetermined pressure is maintained and processing the substrate to be processed mounted on the mounting module; a laser light source module disposed outside of the processing chamber; a monitoring optical system receiving a laser emitted by the laser light source by way of an optical fiber, scanning a laser through the window to illuminate inside the device for processing semiconductor devices, and detecting, through the observation window, scattered light scattered by a particle suspended inside the processing chamber in which the plasma processing means is processing the substrate to be processed and illuminated by the scanning performed by the laser illumination optical system; and a signal processing module receiving, by way of an optical fiber, and processing a detection signal from the scattered light detection optical system and outputting information relating to the particle suspended inside the processing chamber for processing semiconductor devices.

These and other objects, features and advantages of the invention will be apparent from the following more particular description of preferred embodiments of the invention, as illustrated in the accompanying drawings.

BRIEF DESCRIPTION OF THE DRAWINGS

FIG. 22 is a flowchart of the operations performed in the production steps in a semiconductor integrated circuit device that uses an etching processing device with a plasma-suspended particle measuring device according to an eighth embodiment of the present invention.

DESCRIPTION OF THE PREFERRED EMBODIMENTS

The following is a description of the embodiments of the present invention, with references to FIG. 1 through FIG. 24.

The embodiments of the present invention described below are implemented for parallel flat plasma etching devices used in plasma dry etching devices. However, the present invention is not restricted to this, and can also be used in thin-film deposition devices such as sputtering devices and CVD devices, ECR etching devices, microwave etching devices, and other thin-film generation and processing devices such as ashing devices.

Figure 1:
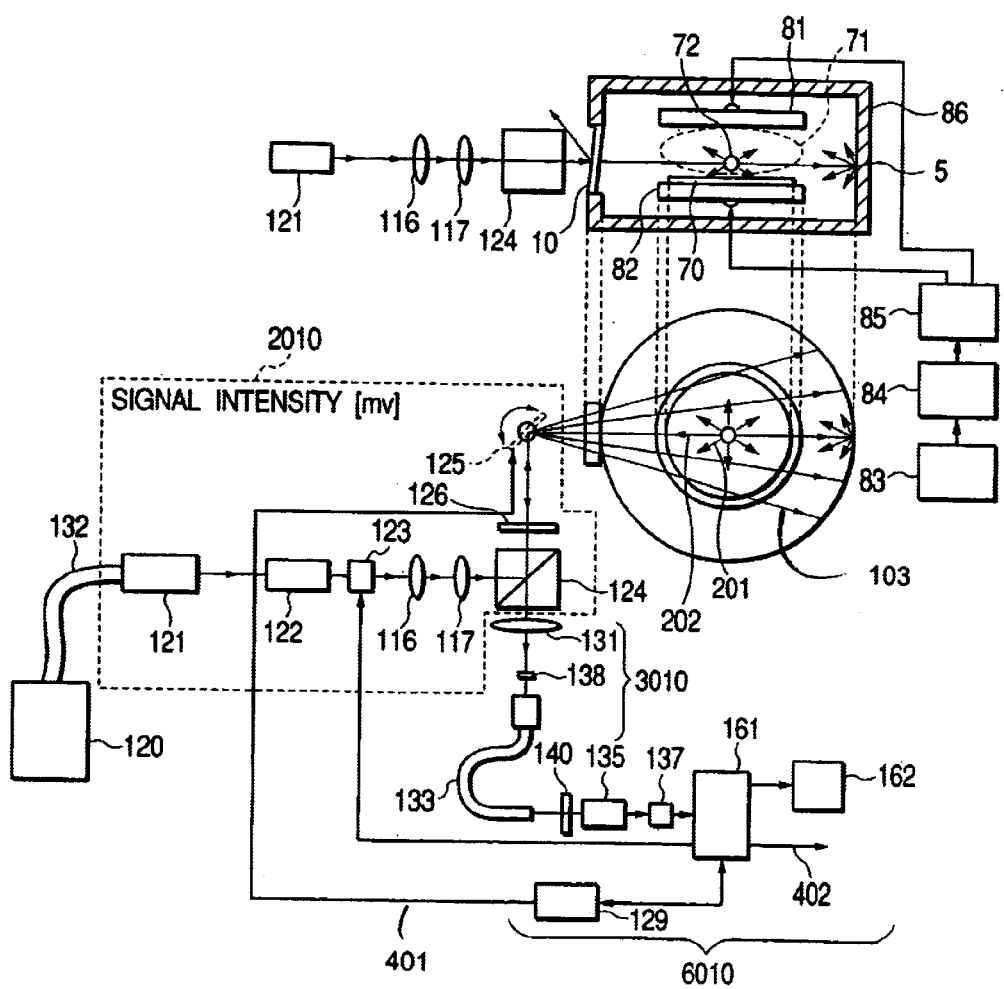
FIG. 1 is a drawing showing the architecture of an etching device equipped with a plasma-suspended particle measuring device according to a first embodiment of the present invention. The figure shows a plane-view and a front-view showing the schematic structure of an etching device equipped with a plasma-suspended particle measuring device according to a first embodiment of the present invention.

First, a first embodiment of the present invention will be described. FIG. 1 shows an etching device and plasma-suspended particle measuring device according to the first embodiment. The plasma-suspended particle measuring device is formed as a single unit from a laser illumination optical system 2010, a scattered light detection optical system 3010, and a signal processing/control system 6010. The laser illumination optical system 2010 and the scattered light detection optical system 3010 are formed as a single unit and are connected by optical fibers to a laser light source 120 and the signal processing/control system 6010.

As FIG. 1 shows, the etching device uses a high-frequency signal from a signal generator 83 to modulate an output voltage from a power amp 84. This high-frequency voltage is distributed by a distributor 85 and is sent to an upper electrode 81 and a lower electrode 82 disposed parallel to each other in a plasma processing chamber 86. The discharge between these electrodes generates the plasma 71 from the etching gas, resulting in the etching of the semiconductor wafer 70, which serves as the activation seed and the object of processing. The high-frequency signal generated by the signal generator 83 can be, for example, a signal with a frequency of 400 kHz. In the etching operation, the progress of etching is monitored and the timing at which to stop etching is detected as accurately as possible so that etching is performed for a predetermined pattern and depth only. When the stopping timing is detected, the output from the power amp 83 is stopped and the semiconductor wafer 70 is ejected from the plasma processing chamber 86.

In the laser illumination optical system 2010, a gain medium 121 (e.g., nedoymium vanadate (Nd:YVO$_4$)) mounted in the main monitoring optical system unit is illuminated by a laser (e.g., an infrared semiconductor laser with a wavelength of 809 nm) from an excitation laser 120 by way of an excitation light optical fiber 132. The excitation laser 120 is installed away from the main monitoring optical system unit. The nedoymium vanadate absorbs the excitation light with a wavelength of 809 nm and emits a strong, uni-directional light with a wavelength of around 1064 nm. Also, nedoymium vanadate has different physical characteristics depending on the orientation of the crystal axis, and emits polarized laser light.

A non-linear optical crystal 122 (e.g., LBO crystal) converts the 1064 nm wavelength light from the nedoymium vanadate to a laser light with a secondary harmonic wavelength of 532 nm.

The laser light with the converted wavelength is intensity-modulated by an intensity modulator 123 at a frequency, e.g., 170 MHz, different from the excitation frequency of the plasma. Then, the laser light is expanded with a collimating lens 116 and focused at the center of a semiconductor wafer 70 by a focusing lens 117.

The intensity modulator 123 can be, for example, an AO (Acousto-Optical) modulator. A signal having a frequency different from the plasma excitation frequency is generated by an oscillator (not shown in the figure) based on control signals from a computer 161. This signal is sent to the intensity modulator 123 to apply intensity modulation at that frequency to the laser that has had its wavelength converted by the non-linear optical crystal 122.

The semiconductor wafer 70 can be illuminated from front to back with a roughly uniform optical energy density by selecting the focal distances of the collimating lens 116 and the focusing lens 117 appropriately and forming the focal depth to be larger than the radius of the semiconductor wafer 70, The focused S-polarized beam described above is reflected by a polarized beam splitter 124 and passes through a quarter-wave plate 126 to form a circularly polarized beam. This is then reflected by a galvano-mirror 125 driven at a high speed. The beam passes through an observation window 10 and enters the plasma processing chamber 86, scanning over the entire surface of the semiconductor wafer 70 in a fan-shape. By scanning with this beam having a long focal depth, the entire surface of the semiconductor wafer 70 can be illuminated with a roughly uniform energy density.

The circularly polarized beam is scattered by a particle 72 suspended in the plasma 71. The component of a particle-scattered light 201 oriented along the same optical axis as the entry beam but going in the opposite direction forms a back-scattered light 202. The back-scattered light 202 is reflected by the galvano-mirror 125, and the circularly polarized component thereof, i.e., the direct reflection component, passes through the quarter-wave plate 126 again to be converted to P-polarized light, which then passes through the polarized beam splitter 124 and is focused by a focal lens 131 into the entry end of an optical fiber 133.

Figure 2:
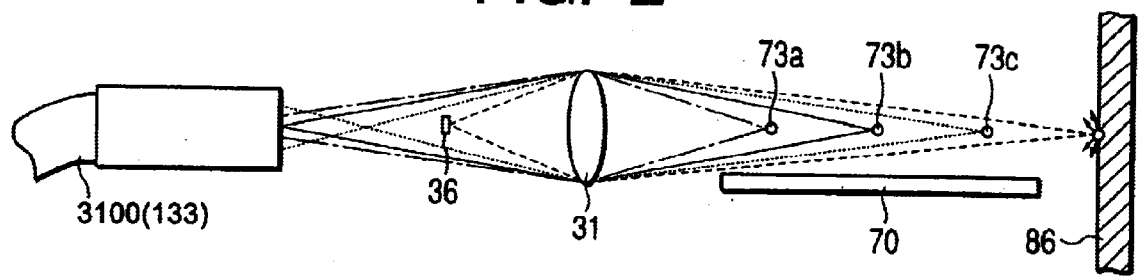
FIG. 2 is a rough front-view showing the schematic relation between the focal position of an optical system on the wafer and an inner wall surface of a processing device.

As shown in FIG. 2, a center 73b of the semiconductor wafer 70 and the light-receiving end of the fiber are in a focal relationship. The particle-scattered light generated above the semiconductor wafer 70 can be received in its entirety by making the light-receiving end of the fiber large enough to receive the defocused particle-scattered light from a wafer front 73a and a wafer back 73c. Thus, in addition to high-speed scanning of a long-focus beam, another characteristic of the present invention is that particles can be detected with a roughly uniform sensitivity over the entire surface of the semiconductor wafer 70.

When the wavelength of the illuminating light is 532 nm as in this embodiment, almost all the polarized light component of the back-scattered light will be the same as the polarized light component of the entry light if the particle diameter is smaller than roughly 10 microns. Thus, in the widely known method for separating polarized light involving S-polarized light illumination and P-polarized light detection (P-polarized light illumination and S-polarized light detection), detected scattering intensity drops significantly, resulting in lowered detection sensitivity. However, by using circularly polarized illumination and circularly polarized detection as in this embodiment, it is possible to restrict the reduction in detection sensitivity accompanying smaller particle diameters. This is another characteristics of the present invention.

Directly reflected light and scattered light from the inner walls of the plasma processing chamber 86 are blocked by a spatial filter 136 installed at a point conjugate to the processing chamber wall in front of the optical fiber used for detection. This prevents entry of these lights into the detection optical fiber 133. As a result, back-scattered light from particles can be detected without influences from light reflected from the inner walls of the processing chamber. This improves detection accuracy and allows detection of smaller suspended particles and particles with minimal back-scattering.

Another characteristic of the present invention is that directly reflected light from the particle observation window 10 is prevented from entering the optical fiber by having the observation window 10 tilted so that the optical axis of the reflected light is shifted from the detection optical axis.

Also, an anti-reflective coating can be applied to the observation window to reduce the intensity of reflective light.

The exit end of the detection fiber 133 is connected to an interference filter 140, which extracts the same wavelength as the laser light (532 nm). An opto-electric converter 135 formed from a photomultiplier tube and the like converts this light to a current signal. The current signal is amplified by an amplifier 137 of the signal processing/control system 6010 and sent to the computer 161. The computer 161 sends a scan control signal 401 to the galvano-mirror 125 by way of a galvano driver 129 and uses a display 162 to display particle scattering intensities at different scan positions while scanning a beam 103.

Figure 3:
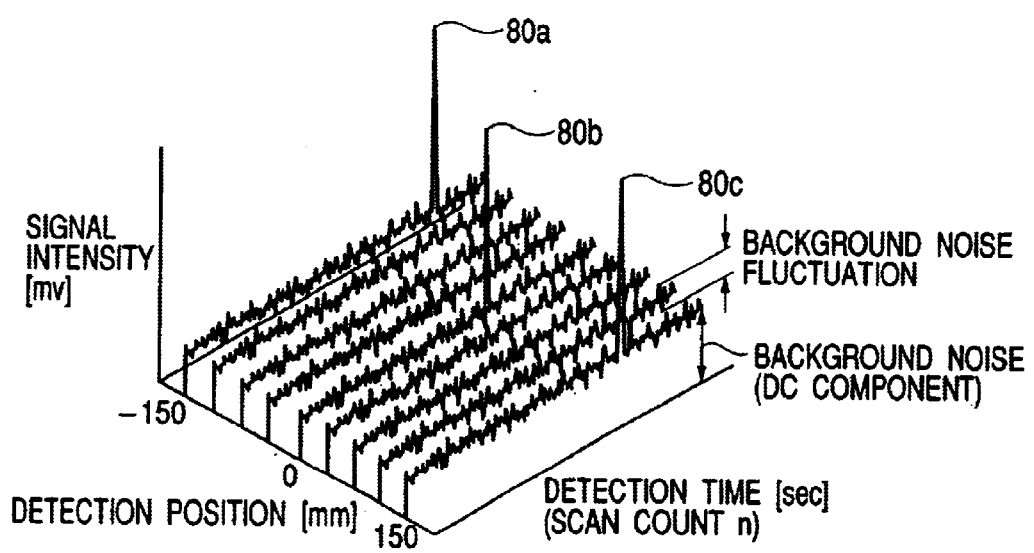
FIG. 3 is a drawing for the purpose of describing how the plasma excitation frequency and the plasma emission are synchronized in the embodiments of the present invention.
Figure 4:
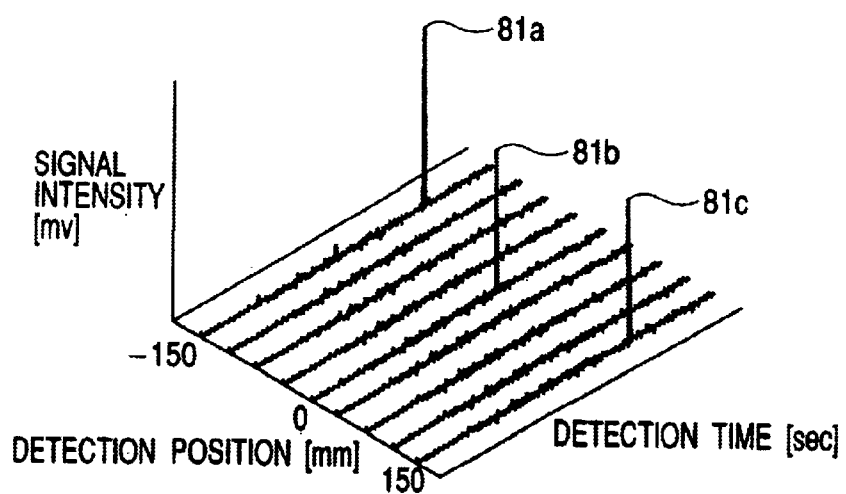
FIG. 4 is a drawing for the purpose of describing how wavelength/frequency separation of particle-scattered light from plasma emission takes place in the embodiments of the present invention.

FIG. 3 and FIG. 4 show sample displays on the display 162. FIG. 3 shows changes in the detection signal, i.e., changes over time, between individual scans of the central region of the wafer along an illumination light 103 over a wafer having a diameter of 300 mm. When light is back-scattered due to a particle suspended in plasma, large pulse signals appear, as shown at three points in FIG. 3. The intensities of the pulse signals can be used to determine the size of the particle. In FIG. 4, the difference between the output from the n-th scan and the output from the (n−1)-th scan is taken for each detection position. This cancels out the DC component of the background noise, and reduces consistent fluctuations. As a result, the particle signal can be evaluated more easily.

Measurements are completed when etching is completed and the wafer 70 is ejected from the processing chamber.

The measurement data is recorded wafer by wafer. The measurement data can be output externally, so that the contamination state of the plasma processing chamber 86 can be monitored continuously through an external output signal 402.

With this embodiment, back-scattered light is detected. This allows illumination and back-scattered light detection to be performed through a single observation window, and the illumination optical system and the detection optical system can be formed as a single, compact monitoring optical system. Furthermore, by separating the excitation light source from the main monitoring optical system unit, the cooling heat sink for the excitation light source can be separated from the main monitoring optical system unit, thus significantly reducing the size of the monitoring optical system.

With the size of the monitoring optical system in this manner, the system can be easily attached to observation windows of existing semiconductor production devices with fewer spatial restrictions around the attachment position. Also, by providing a compact design, the section of the monitoring optical system that attaches to the observation window can be made to allow easy attachment and removal so that multiple semiconductor production devices can be monitored successively with a single detection device.

This embodiment also provides scanning with a long-focus beam so that the entire surface of the wafer can be scanned with a roughly uniform energy illumination and detection sensitivity. This allows the contamination status inside the etching device processing chamber to be monitored in real time. As a result, wafer defects resulting from adhesed particles can be reduced, and the timing at which the device should be cleaned can be determined accurately. Also, the frequency of pre-checking operations using dummy wafers can be reduced, thus reducing costs and improving production efficiency. Furthermore, the timing at which particles are generated during processing can be determined, thus providing information that is useful in setting up measures to reduce particles.

Figure 5:
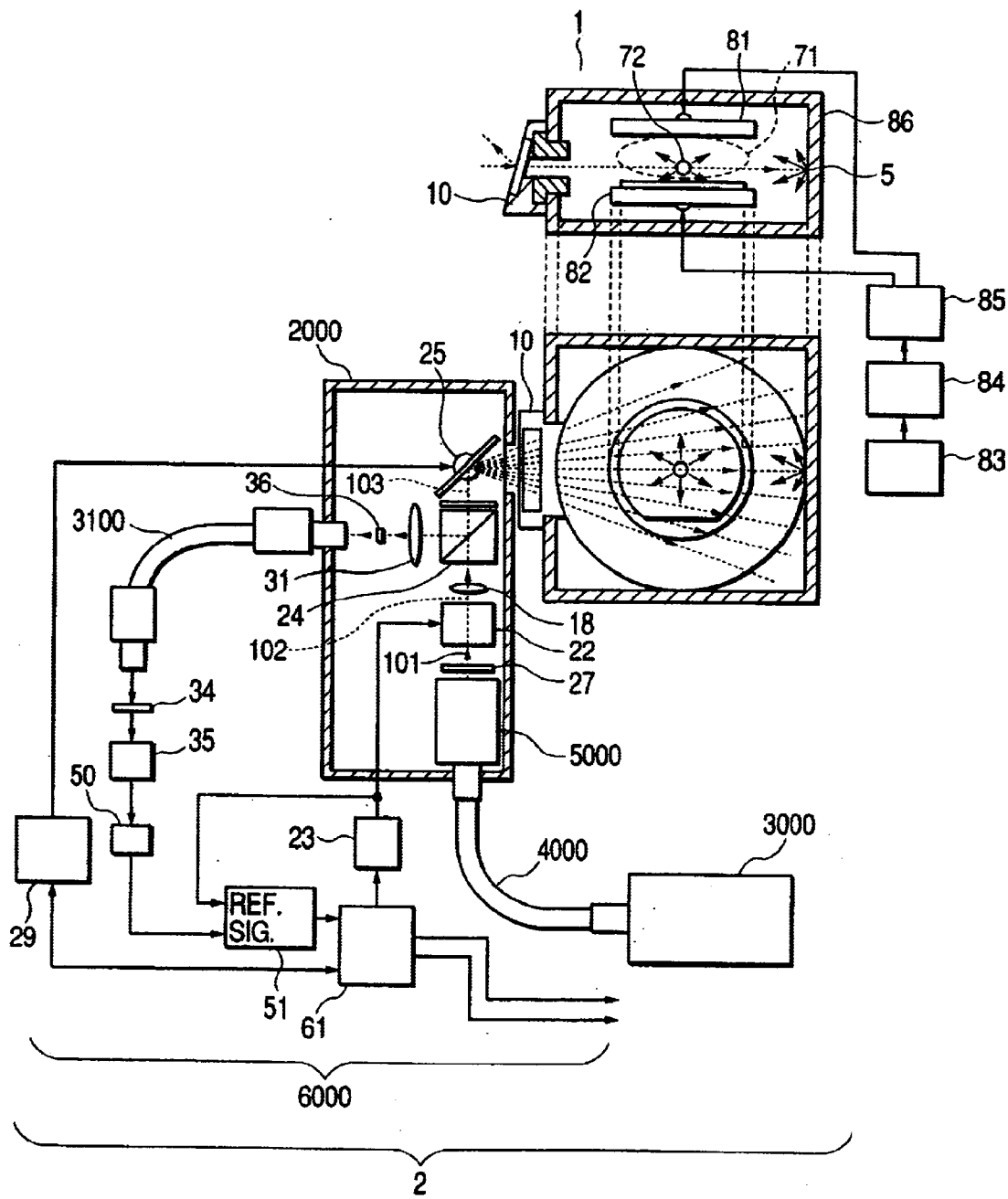
FIG. 5 is a drawing showing the architecture of an etching device equipped with a plasma-suspended particle measuring device according to a second embodiment of the present invention.

Next, a plasma etching device according to a second embodiment of the present invention will be described. FIG. 5 shows an etching processing device equipped with a device for measuring particles suspended in plasma according to the second embodiment.

As shown in FIG. 5, the etching processing device uses a high-frequency signal from the signal generator 83 to modulate the output voltage from the power amp 84. This high-frequency voltage is distributed by the distributor 85 and applied to the upper electrode 81 and the lower electrode 82 oriented parallel to each other in the plasma processing chamber 86. The discharge between these electrodes generates the plasma 71 from the etching gas, resulting in the etching of the semiconductor substrate (wafer) W, which serves as the activation seed and the object of processing. The high-frequency signal can be, for example, a signal with a frequency of 400 kHz.

A plasma-suspended particle measuring device 2 is formed primarily from a laser illumination/scattered light detection optical system 2000 and a control/signal processing system 6000. The illumination-exit/detection light entry section of the laser illumination/scattered light detection optical system 2000 is positioned so that it faces the observation window 10 disposed on a side surface of the plasma processing chamber 86.

Figure 6:
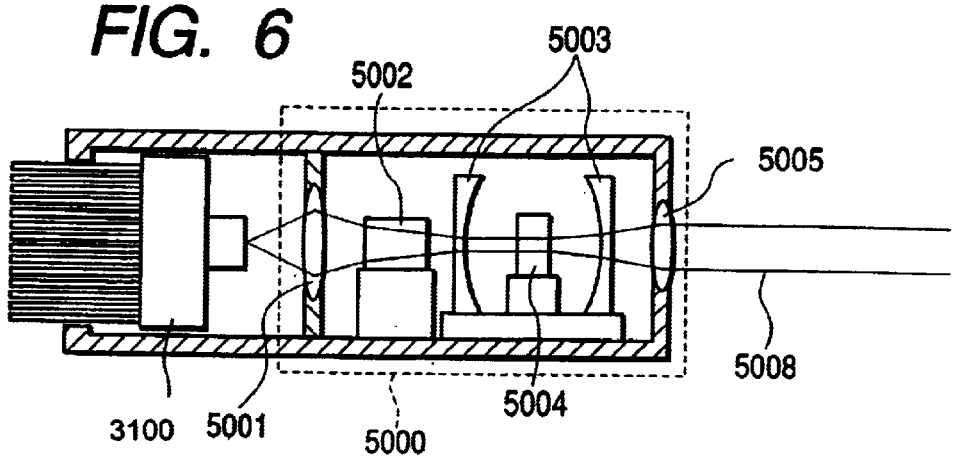
FIG. 6 is a drawing for the purpose of describing a standard architecture of a solid-state laser with semiconductor laser excitation according to a second embodiment of the present invention.
Figure 7:
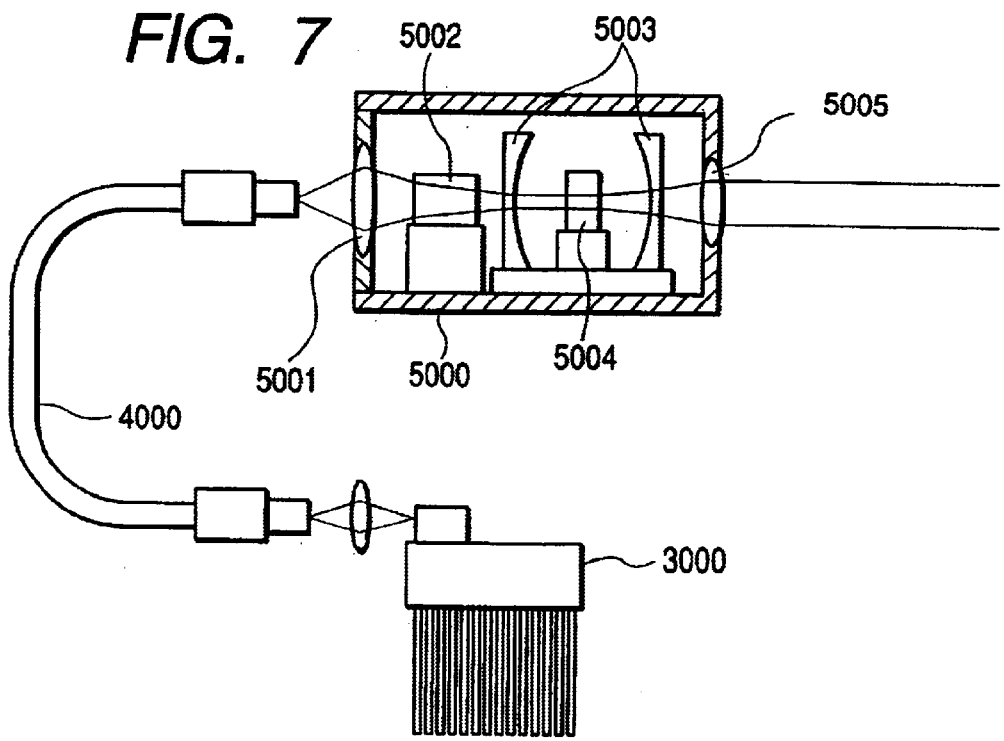
FIG. 7 is a roughly front-view drawing showing the schematic architecture of a solid-state with external laser excitation with separate excitation light source and wavelength converter according to a second embodiment of the present invention.

A laser light is sent into the plasma processing chamber 86. The intensity of the light scattered by a particle in the plasma processing chamber 86 is inversely proportional to the square of the wavelength of the illumination laser (if the particle diameter and the laser wavelength are of the same order) and proportional to the intensity of the illumination laser. Also, it would be desirable for the laser light source to be compact so that the plasma-suspended particle measuring device can be compact. Currently marketed laser light sources that are both compact and have a short wavelength includes, for example, a solid-state laser with excitation light from a semiconductor laser 3000 (e.g., 532 nm wavelength and output up to 500 mW), as shown in FIG. 6. However, with many solid-state lasers with integrated excitation light sources, the excitation light source (semiconductor laser) and its optical elements may be small but the heat sink used to dissipate heat from the excitation light source can be big. This makes forming a compact plasma-suspended particle measuring device difficult.

In this embodiment, the semiconductor laser 3000 and a wavelength converter 5000 from the solid-state laser with integrated excitation light source described above are separated, as shown in FIG. 7. The wavelength converter 5000 is installed in the plasma-suspended particle measuring device 2 to provide a compact plasma-suspended particle measuring device.

Figure 8:
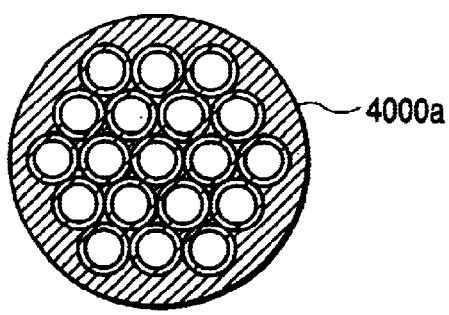
FIG. 8 is a cross-section drawing showing the cross-section drawing of a fiber bundle.

First, laser light from the semiconductor laser 3000 (e.g., a semiconductor laser with a wavelength of 809 nm) is guided by an optical fiber 4000 to the laser illumination/scattered light detection optical system 2000. Since the intensity of the laser light that ultimately enters the plasma processing chamber 86 is proportional to the intensity of the semiconductor laser 3000, the semiconductor laser 3000 may have a high output of several watts. Using a fiber bundle of multiple optical fibers, as shown in FIG. 8, is an effective method for guiding this high-output laser light. The laser light guided by the optical fiber 4000 is guided to the wavelength converter 5000 disposed in the laser illumination/scattered light-detection optical system 2000. The laser light entering the wavelength converter 5000 is focused by a focusing lens 5001 and illuminates a gain medium 5002 (e.g., a neodymium vanadate (Nd:VO$_4$) crystal or a neodymium YAG (Nd:YAG) crystal). The gain medium 5002, e.g., neodymium vanadate, absorbs the excitation light with the 809 nm wavelength and discharges a powerful, uni-directional light at a wavelength of around 1064 nm. Neodymium vanadate, which is a material having different physical characteristics depending on the orientation of the crystal axis, also emits polarized laser light. The polarized light having a specific wavelength emitted by the gain medium 5002 is then converted to a different wavelength by a non-linear optical crystal 5004 (e.g., a crystal generating secondary harmonic frequencies) disposed in a resonator 5003. The non-linear optical crystal 5004, e.g., an LBO crystal, converts the laser light from a wavelength of 1064 nm to a wavelength of 532 nm. The resonator 5003 applies wavelength selection on the beam with the wavelength converted by the non-linear optical crystal 5004, forming a laser light 5008 with a narrow spectrum. Next, this polarized laser light 5008 with a narrow spectrum and a specific wavelength is converted to parallel light by a collimating lens 5005. This parallel beam is converted to a P-polarized beam 101 by a half-wave plate 27 and enters an AO (Acousto-Optical) modulator 22. If the laser light 5008 is already P-polarized, the half-wave plate 27 is not needed. The AO modulator 22 receives a square-wave signal, e.g., with a frequency of 170 kHz preferably with a 50% duty cycle, from an oscillator 23 to provide intensity modulation of the P-polarized beam 101 at that frequency. In this embodiment, where the high-frequency voltage applied to the electrodes of the etching processing device has a frequency of 400 kHz, the laser intensity modulation frequency should be a frequency such as 170 kHz that is different from 400 kHz and the harmonic frequencies thereof such as 800 kHz, 1.2 MHz, . . . . The reason for this will be described later.

The intensity-modulated P-polarized beam 102 is focused at the center of the wafer W by a focusing lens 18, passes through a low-loss polarizing beam splitter 24, and is converted to a circularly polarized beam 103 by a quarter-wave plate 26. The beam is then reflected by a galvano-mirror 25 and is guided into the processing chamber through the observation window 10 disposed on a side surface of the plasma processing chamber 86. The galvano-mirror 25 is rotated so that the beam scans a plane parallel to the wafer surface, thus providing illumination (particle detection) over the entire plane above the wafer.

The observation window 10 is reflected by the galvano-mirror 25 and passes through the quarter-wave plate 26 again to form S-polarized light, which is then reflected by the polarizing beam splitter 24 and enters a particle-scattered light detection optical fiber 3100, generating significant noise. To prevent noise from this light reflected off of the observation window, the observation window 10 is sloped so that light reflected from the surface is shifted from the detection optical axis, preventing detection.

Figure 9:
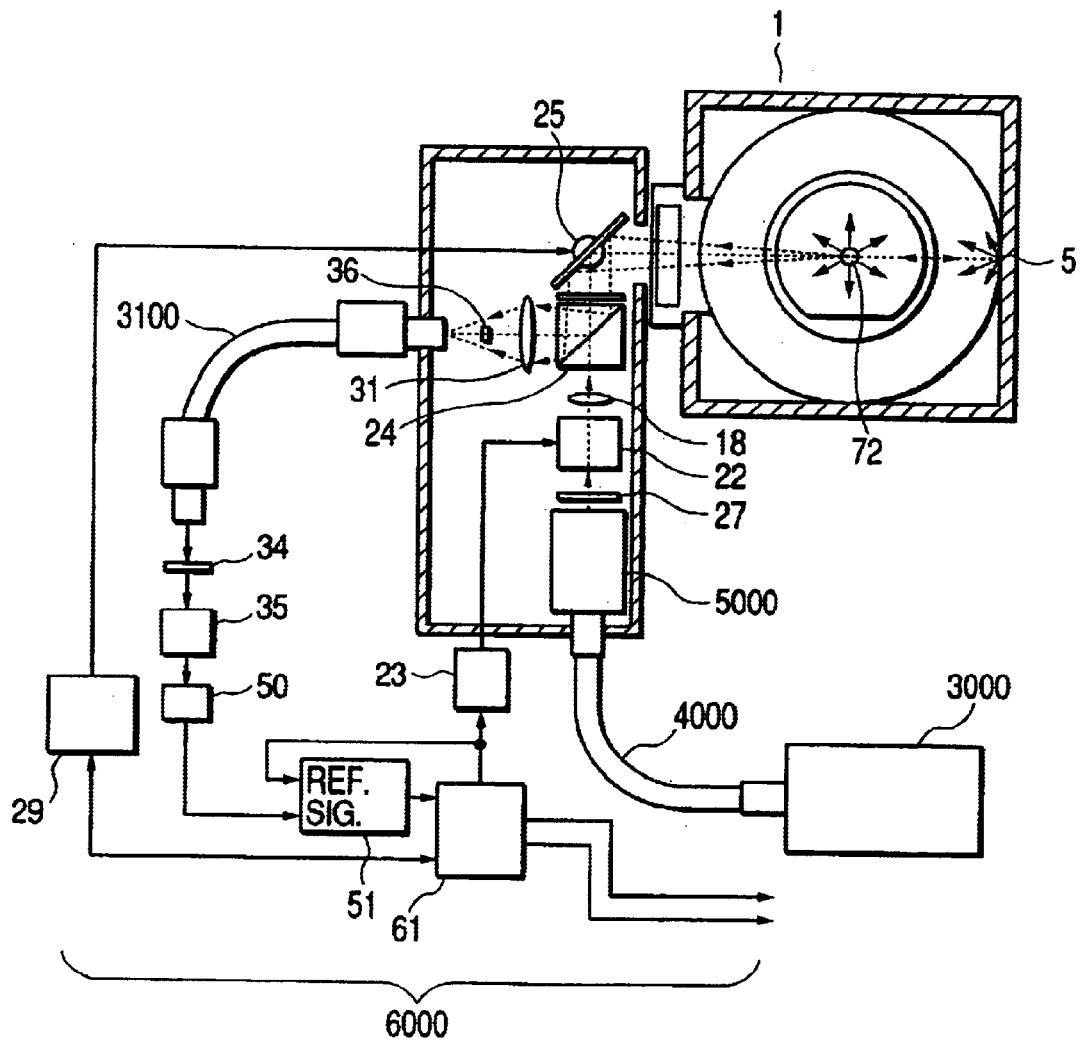
FIG. 9 is a drawing for the purpose of describing the schematic architecture of an etching device equipped with an optical system for detecting particle-scattered light according to a second embodiment of the present invention.

Next, a method for detecting particle-scattered light will be described using FIG. 2 and FIG. 9. The circularly polarized beam 103 guided into the plasma processing chamber 86 is scattered by a suspended particle 72 in the plasma. Back-scattered light, which is the component of the particle-scattered light that propagates along the same optical axis as the circularly polarized beam 103, passes through the observation window 10, is reflected by the galvano-mirror 25, and extends to the polarizing beam splitter 24. The circularly polarized component of the back-scattered light, which corresponds to the directly reflected component, passes through the quarter-wave plate 26 again to form S-polarized light. This is reflected at a low loss by the polarizing beam splitter 24 and is focused on the entry plane of the particle-scattered light detection optical fiber (133, as shown in FIG. 1) by a focusing lens 31. As shown in FIG. 2, the wafer center 73b and the entry plane of the detection optical fiber (133, as shown in FIG. 1) are in a focal relationship, but the light-receiving area of the entry end is large enough to allow detection of de-focused light scattered from the ends 73a, 73c of the wafer. As a result, particle-scattered light from the front of the wafer to the back can be detected at roughly the same sensitivity. To provide a layer light-receiving plane, the method shown in FIG. 8 of using a fiber bundle is effective The scattered light generated by an inner wall 5 of the processing chamber is focused in front of the light-receiving plane of the particle-scattered light detection optical fiber (133, shown in FIG. 1), so a spatial filter 36 is disposed at the focal position to block the light. The exit end of the particle-scattered light detection optical fiber (133, shown in FIG. 1) is connected to a spectroscope 34 formed from a monochrometer or interference filter set up for the wavelength of the polarized laser light 5008. This separates the wavelength component of the particle-scattered light from the plasma light. Then, opto-electric conversion is performed by an opto-electric converter 35.

The opto-electrically converted detection signal is amplified by an amp 50. A lock-in amp 51 performs synchronized detection using a signal output from the oscillator 23 used for intensity modulation of the laser light. The reference signal is a square-wave signal with a frequency of 170 kHz and a duty cycle of 50%. The particle-scattered light component having a frequency of 170 kHz is extracted from this detection signal.

Figure 10:
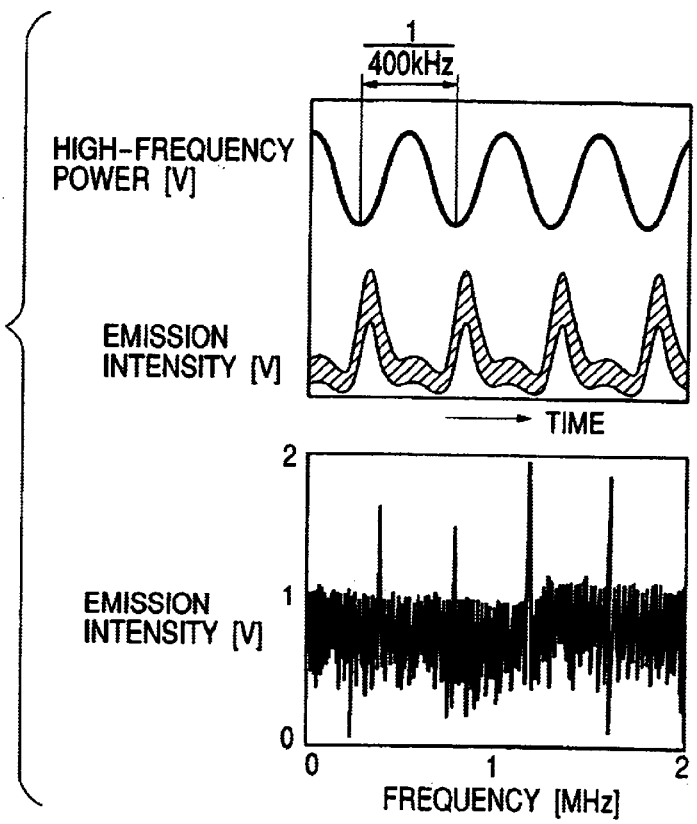
FIG. 10 is a drawing showing the variations over time of detected light intensity over the wafer 9 [?] according to a second embodiment of the present invention.
Figure 11:
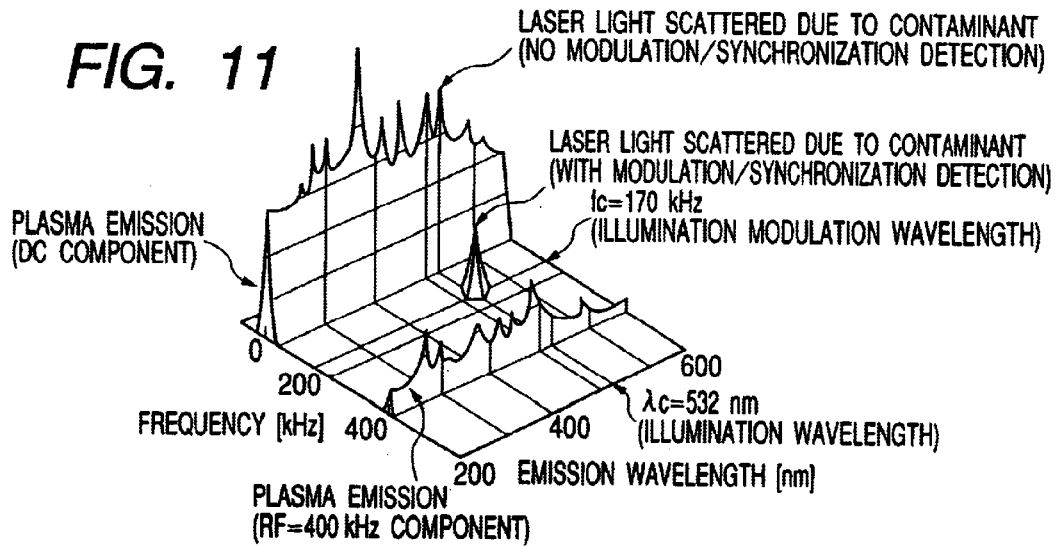
FIG. 11 is a drawing showing the variations over time of particle signal intensity over the wafer 9 [?] according to a second embodiment of the present invention.

As FIG. 10 shows, the inventors of the present invention have experimentally verified that the intensity of the plasma light is synchronized with the modulation frequency of the high-frequency voltage used for plasma excitation. For example, the light emitted from the plasma by the high-frequency voltage with a plasma excitation frequency of 400 kHz, as described above, is separated by wavelength using the spectroscope 34. Modulation and synchronized detection is performed at a frequency of 170 kHz, which is different from the plasma excitation frequency and integer multiples thereof. The resulting particle signal is separated from the plasma emission by wavelength and frequency, as shown in FIG. 11. The present inventors have experimentally confirmed that this method can be used to provide sensitive detection of very weak particle-scattered light in plasma emissions. As shown in FIG. 11, the plasma emissions are distributed continuously over wavelength, but are arranged discretely over frequency, with empty regions. Thus, by projecting a laser light with a wavelength of, for example, 532 nm, that has been intensity modulated with a frequency different from the plasma emission frequency, e.g., 170 kHz, and extracting the 532 nm wavelength component and the 170 kHz component from the detected light, i.e., extracting only peak signals, the light scattered by particles can be separated from the plasma emissions and detected.

The output from the lock-in amp 51 is sent to the computer 61. The computer 61 sends a scan signal to the galvano-mirror 25 by way of the galvano driver 29, and a beam is scanned while the particle signal captured for the scanned positions are displayed sequentially on a display in a format such as shown in FIG. 3. This sample display shows signal intensities for scans by the illumination light 9 over a wafer with a diameter of 300 mm. When light is scattered by particles suspended in the plasma, large pulse signals such as the pulse signals 80*a*, 80*b*, 80*c* shown in FIG. 3 appear. As shown in FIG. 4, taking the difference between the output from the n-th scan and the output from the (n−1)-th scan cancels the DC component of background noise, allowing easy evaluation of particle signals. The computer 61 calculates particle sizes by comparing detected particle signal intensities with signal intensities associated with particle diameters as obtained from prior experiments. Also, the number of particles is determined from the pule signal. Also, particle positions are determined from the scan positions at which signals are detected. Furthermore, the computer 61 determines the contamination status inside the processing chamber based on the number and sizes of particles. If the total number of particles generated exceeds a reference value set up ahead of time, the etching operation can be halted and information can be output, e.g., an alarm or the like is used to notify a plasma processing device operator.

In the embodiment described above, detection is performed for back-scattered light. This allows the laser illumination/scattered light detection optical systems to be formed as a single unit that can be used with processing devices that only have a single observation window 10. In addition, adjustment of optical axes and the like is easier compared to structures in which the illumination optical system and the detection optical system are formed separately, thus allowing the optical system as a whole to be more compact. The excitation light source, which is the element in the illumination light source that is the biggest heat source and that requires a large heat-dissipating heat sink, is separated from the laser illumination/scattered light detection optical system. As a result, the optical system as a whole can be made even more compact.

Also, compared to other elements in the plasma-suspended particle measuring device, the excitation light source has a relatively short lifespan and can be expected to have a high frequency of being replaced. By separating this excitation light source from the laser illumination/scattered light detection optical system, the excitation light source can be replaced directly without having to manipulate the laser illumination/scattered light detection optical system. This improves maintenance efficiency and reduces the downtime of the device.

Also, with the modulation/synchronized detection system used in this embodiment, weak particle-scattered light can be separated by wavelength and frequency from plasma emissions, which obstruct the detection of particles in plasma. Thus, compared to conventional methods that only separate by wavelength, the detection sensitivity for particles suspended in plasma can be improved significantly. With the conventional method using wavelength separation only, the minimum detection sensitivity was a diameter of about 1 micron. However, with the method of the present invention, the minimum detection sensitivity can be improved to a diameter of about 0.2 microns, thus allowing stable particle detection for the entire wafer surface. Also, since this embodiment uses detection of back-scattered light, the illumination beam can be rotationally scanned horizontally, thus allowing the two-dimensional distribution of particles to be easily known.

Also, this embodiment performs particle detection for the entire wafer surface and is able to determine the number, size, and distribution of particles. Thus, the operator can check this information in real time, e.g., through a display.

Since this embodiment allows real-time evaluation of the contamination status within the processing chamber based on the determined number, size, and distribution of particles, it would be possible, for example, to optimize the cleaning schedule and improve the operating efficiency of the device. Also, clustered defects (large numbers of defects being generated all at once) can be prevented, leading to improved yield. Also, since processing proceeds while the contamination status in the processing chamber is continuously monitored, the semiconductor substrates and liquid crystal substrates produced in this manner will be produced in an environment that does not contain more than a predetermined level of particles, thus providing products with high quality and reliability.

Also, this embodiment can reduce the frequency of evaluations of processing chamber contamination using dummy wafers and contamination status evaluations via random inspections. Thus, the costs involved in the use of dummy wafers can be reduced.

Figure 12:
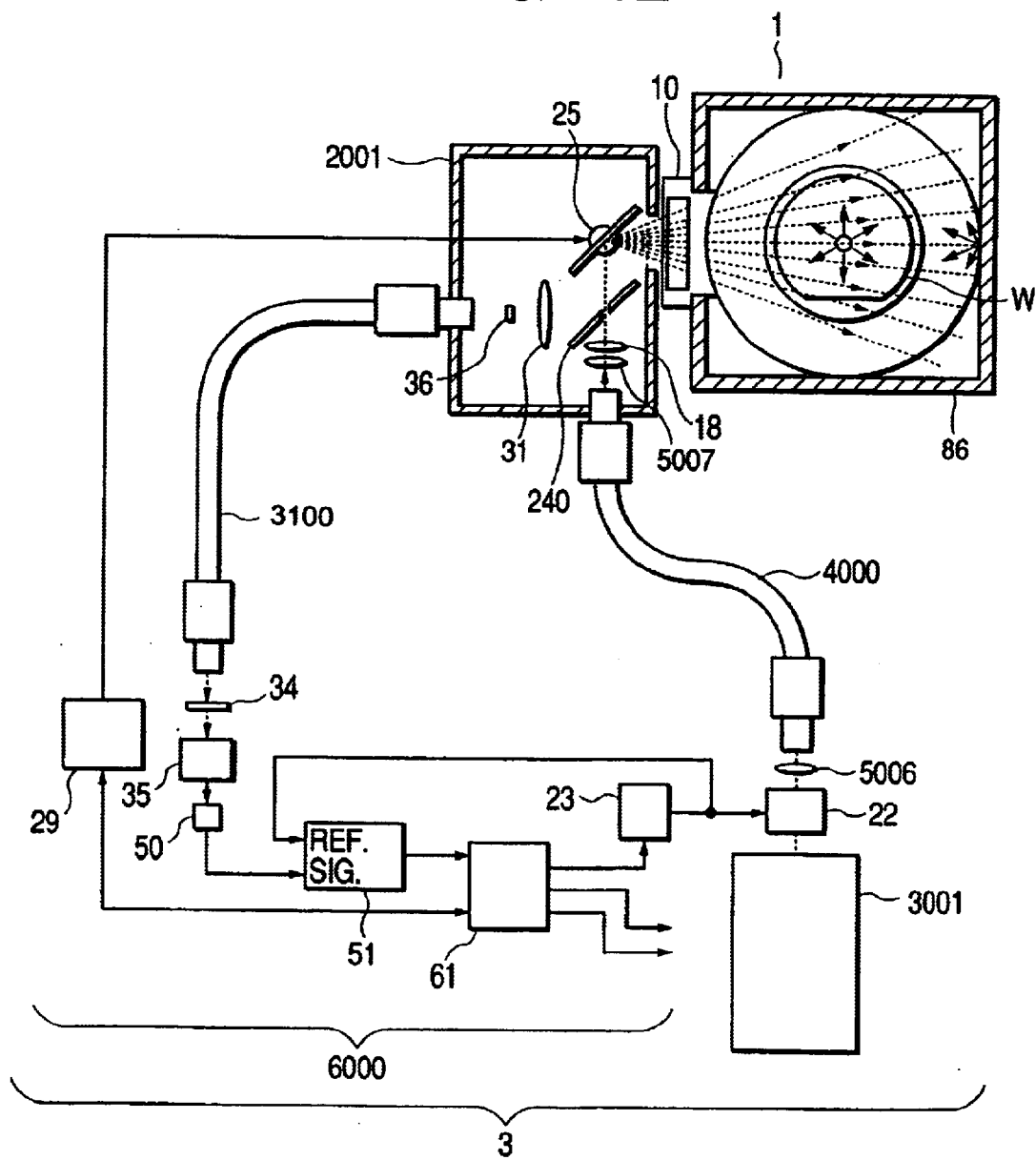
FIG. 12 is a roughly plan drawing showing the schematic architecture of an etching processing device equipped with a plasma-suspended particle measuring device according to a third embodiment of the present,invention.
Figure 13:
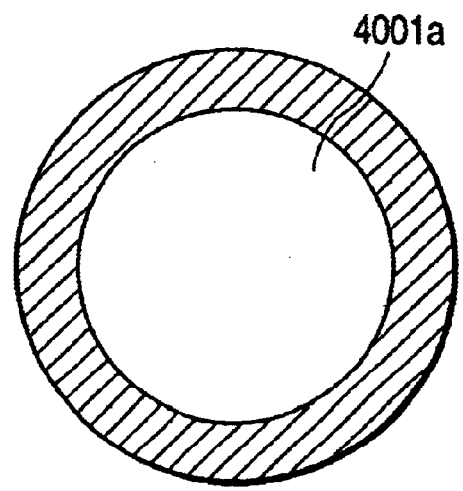
FIG. 13 is a cross-section drawing of a large-diameter fiber according to a third embodiment of the present invention.
Figure 14:
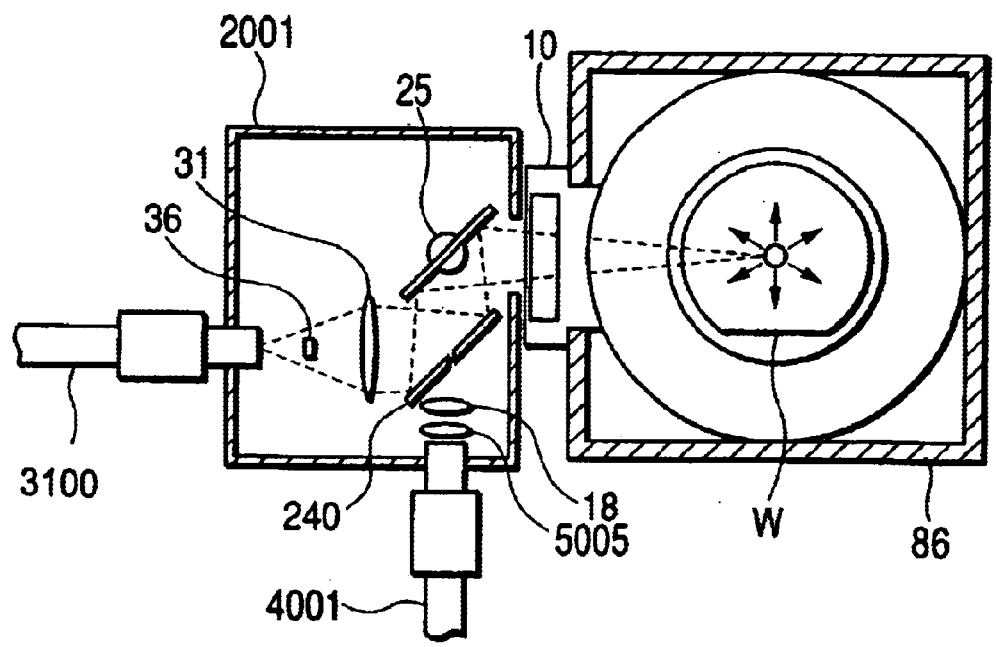
FIG. 14 is a plan drawing of an etching device equipped with an optical system for detecting particle-scattered light according to a third embodiment of the present invention.

Next, a plasma etching device according to a third embodiment of the present invention will be described using FIG. 12 through FIG. 14. FIG. 12 is a drawing showing the architecture of an etching processing device equipped with a plasma-suspended particle measuring device according to the second embodiment.

In a etching processing device 1 shown in FIG. 12, a high-frequency signal from the signal generator 83 modulates the output voltage from the power amp 84. This high-frequency voltage is distributed by the distributor 85 and applied to the upper electrode 81 and the lower electrode 82 oriented parallel to each other in the plasma processing chamber 86. Discharge between the electrodes generates the plasma 71 from the etching gas, resulting in the etching of the semiconductor substrate (wafer) W, which serves as the activation seed and the object of processing. The high-frequency signal can be, for example, a signal with a frequency of 400 kHz.

A plasma-suspended particle measuring device 3 is formed primarily from a laser illumination/scattered light detection optical system 2001 and the control/signal processing system 6000. The illumination exit/detection light entry section of the laser illumination/scattered light detection optical system 2001 is positioned so that it faces the observation window 10 disposed on a side surface of the plasma processing chamber 86.

The difference between this and the second embodiment described above is that the illumination laser light source, which includes the excitation light source and the wavelength converter, is disposed outside of the laser illumination/scattered light detection optical system 2001. Thus, even if a high-output illumination is used so that the size of the laser light source increases (and the accompanying heat-dissipating heat sink increases in size), the laser illumination/scattered light detection optical system 2001 will not increase in size.

First, a laser beam from the laser light source 3001 (e.g., a solid-state laser with a wavelength of 532 nm and an output of up to 500 mW) enters the AO modulator 22. The AO modulator 22 receives a square-wave signal, e.g., with a frequency of 170 kHz preferably with a 50% duty cycle, from the oscillator 23 to provide intensity modulation qf the P-polarized beam 101 at that frequency. As with the second embodiment described above, in this embodiment, where the high-frequency voltage applied to the electrodes of the etching processing device has a frequency of 400 kHz, the laser intensity modulation frequency should be a frequency such as 170 kHz that is different from 400 kHz and the harmonic frequencies thereof such as 800 kHz, 1.2 MHz, . . . . The intensity-modulated beam is guided to the laser illumination/scattered light detection optical system 2001 by a fiber bundle 4000. It would also be possible to use a large-diameter fiber as shown in FIG. 13 in place of the fiber bundle 4000. This type of large-diameter fiber has the advantage of a large core diameter and allows beams to enter relatively easily with low loss. The beam existing from the fiber bundle or the large-diameter fiber is an unpolarized beam. The laser light entering the laser illumination/scattered light detection optical system 2001 is focused at the center of the wafer W by the focusing lens 18. The focused beam passes through a hole larger enough for the beam formed on a mirror 240. The beam is reflected by the galvano-mirror 25 and is guided into the plasma processing chamber 86 through the observation window 10 disposed on a side surface of the plasma processing chamber 86. The galvano-mirror 25 is rotated to scan the beam along a plane parallel to the wafer surface, thus providing illumination (particle detection) over the entire plane over the wafer.

Light reflected from the observation window 10 is reflected by the galvano-mirror 25 and is then reflected by the mirror 240 and enters a particle-scattered light detection optical fiber 3100. As in the second embodiment described above, the observation window 10 is sloped to prevent noise. Next, a method for detecting particle-scattered light will be described using FIG. 14. The unpolarized illumination beam guided into the plasma processing chamber 86 is scattered by a suspended particle 72 in the plasma. Back-scattered light, which is the component of the particle-scattered light that propagates along the same optical axis as the unpolarized illumination beam, passes through the observation window 10 and is reflected by the galvano-mirror 25 and the mirror 240. The light is then focused on the entry plane of the particle-spattered light detection optical fiber (133, as shown in FIG. 1) by the focusing lens 31. As with the second embodiment described above, the wafer center 73b and the entry plane of the particle-scattered light detection optical fiber (133, shown in FIG. 1) are in a focal relationship as shown in FIG. 2, but the light-receiving area of the entry end is large enough to allow detection of de-focused light scattered from the ends 73a, 73c of the wafer. As a result, particle-scattered light from the front of the wafer to the back can be detected at roughly the same sensitivity. The scattered light generated by an inner wall 5 of the processing chamber is focused in front of the light-receiving plane of the particle-scattered light detection optical fiber (133, shown in FIG. 1), so a spatial filter 36 is disposed at the focal position to block the light. The subsequent device architecture and functions provided for signal processing and evaluating contamination generation are similar to the first embodiment described above, so their descriptions will be omitted.

With this embodiment as described above, detection is performed for back-scattered light. This allows the laser illumination/scattered light detection optical systems to be formed as a single unit that can be used with processing devices that only have a single observation window 10. In addition, adjustment of optical axes and the like is easier compared to structures in which the illumination optical system and the detection optical system are formed separately, thus allowing the optical system as a whole to be more compact. Furthermore, by separating the large excitation light source from the laser illumination/scattered light detection optical systems, the optical system as a whole can be made more compact.

Also, compared to other elements in the plasma-suspended particle measuring device, the excitation light source has a relatively short lifespan and can be expected to have a high frequency of being replaced. By separating this excitation light source from the laser illumination/scattered light detection optical system, the excitation light source can be replaced directly without having to manipulate the laser illumination/scattered light detection optical system. This improves maintenance efficiency and reduces the downtime of the device.

Also, with the modulation/synchronized detection system used in this embodiment, weak particle-scattered light can be separated by wavelength and frequency from plasma emissions, which obstruct the detection of particles in plasma. Thus, compared to conventional methods that only separate by wavelength, the detection sensitivity for particles suspended in plasma can be improved significantly. With the conventional method using wavelength separation only, the minimum detection sensitivity was a diameter of about 1 micron. However, with the method of the present invention, the minimum detection sensitivity can be improved to a diameter of about 0.2 microns, thus allowing stable particle detection for the entire wafer surface.

Also, since this embodiment uses detection of back-scattered light, the illumination beam can be rotationally scanned horizontally, thus allowing the two-dimensional distribution of particles to be easily known.

Also, this embodiment performs particle detection for the entire wafer surface and is able to determine the number, size, and distribution of particles. Thus, the operator can check this information in real time, e.g., through a display.

Since this embodiment allows real-time evaluation of the contamination status within the processing chamber based on the determined number, size, and distribution of particles, it would be possible, for example, to optimize the cleaning schedule and improve the operating efficiency of the device. Also, clustered defects (large numbers of defects being generated all at once) can be prevented, leading to improved yield. Also, since processing proceeds while the contamination status in the processing chamber is continuously monitored, the semiconductor substrates and liquid crystal substrates produced in this manner will be produced in an environment that does not contain more than a predetermined level of particles, thus providing products with high quality and reliability.

Also, this embodiment can reduce the frequency of evaluations of processing chamber contamination using dummy wafers and contamination status evaluations via random inspections. Thus, the costs involved in the use of dummy wafers can be reduced.

Figure 15:
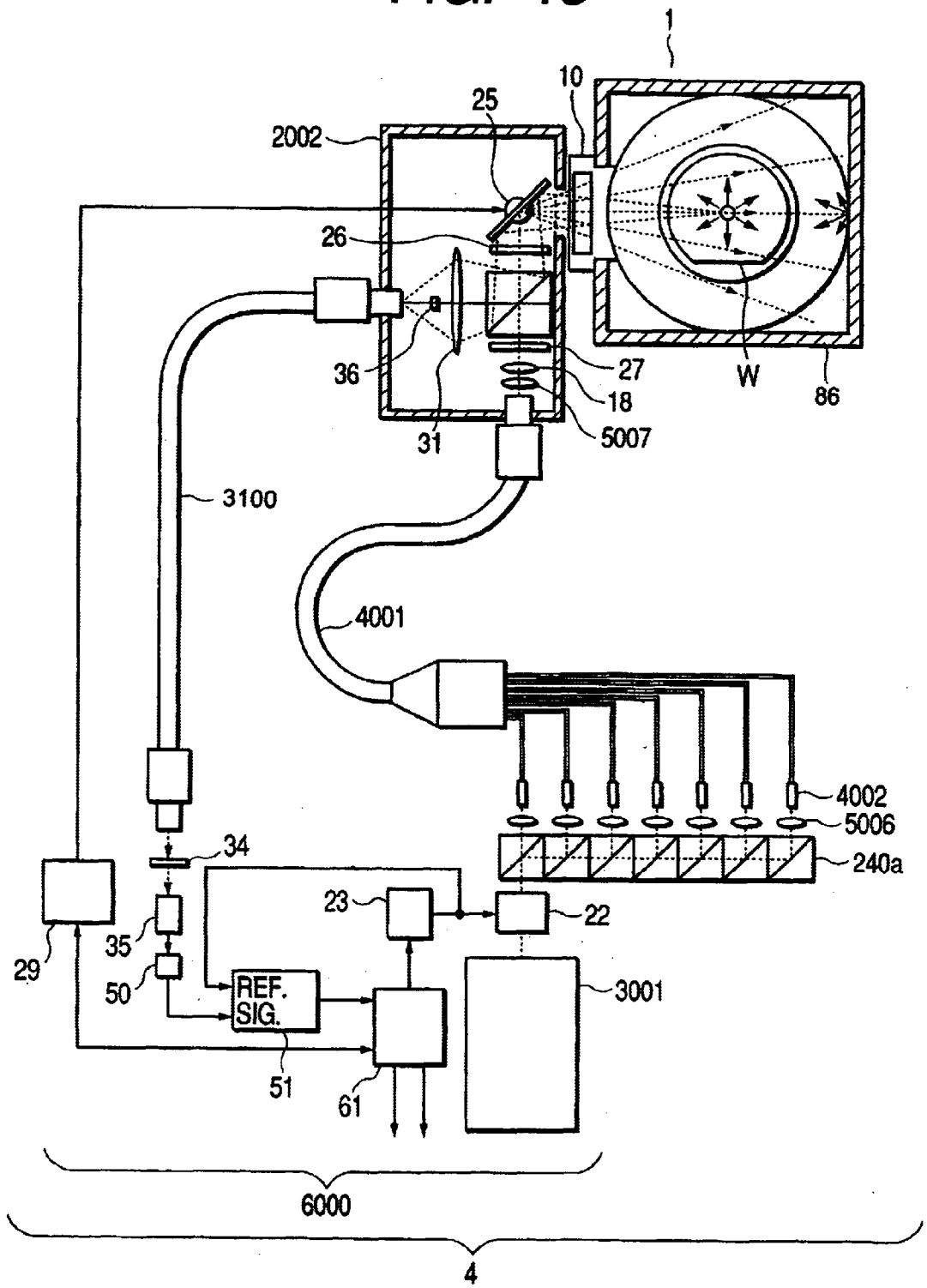
FIG. 15 is a plan drawing showing the schematic architecture of an etching processing device equipped with a plasma-suspended particle measuring device according to a fourth embodiment of the present invention.

Next, a plasma etching device according to a fourth embodiment of the present invention will be described using FIG. 15 through FIG. 18. FIG. 15 shows the architecture of an etching processing device equipped with a plasma-suspended particle measuring device according to the fourth embodiment.

As shown in FIG. 15, the etching processing device uses a high-frequency signal from the signal generator 83 to modulate the output voltage from the power amp 84. This high-frequency voltage is distributed by the distributor 85 and applied to the upper electrode 81 and the lower electrode 82 oriented parallel to each other in the plasma processing chamber 86. The discharge between these electrodes generates the plasma 71 from the etching gas, resulting in the etching of the semiconductor substrate (wafer) W, which serves as the activation seed and the object of processing. The high-frequency signal can be, for example, a signal with a frequency of 400 kHz.

The plasma-suspended particle measuring device 4 is formed primarily from a laser illumination/scattered light detection optical system 2002, the laser light source 3001, a beam splitter 240a, a polarization plane retention fiber 4002, a polarization plane retention fiber bundle 4001, and the control/signal processing system 6000. The illumination exit/detection light entry section of the laser illumination/scattered light detection optical system 2002 is positioned so that it faces the observation window 10 disposed on a side surface of the plasma processing chamber 86.

The difference between this embodiment and the second embodiment and the third embodiment described above is that the laser beam from the illumination laser light source is split into multiple beams, and each of the split beams are coupled to a polarization plane retention fiber. These polarization plane retention fibers are bundled so that their polarization directions are all the same at the exit plane. The polarized laser light from these bundled polarization plane retention fibers are guided to the laser illumination/scattered light detection optical system 2002. Thus, high-power polarized laser illumination can be provided without increasing the size of the laser illumination/scattered light detection optical system 2002.

First, a laser beam from the laser light source 3001 (e.g., a solid-state laser with a wavelength of 532 nm and an output of up to 500 mW) enters the AO modulator 22. The AO modulator 22 receives a square-wave signal, e.g., with a frequency of 170 kHz preferably with a 50% duty cycle, from the oscillator 23 to provide intensity modulation of the P-polarized beam 101 at that frequency. As with the first and second embodiment described above, in this embodiment, where the high-frequency voltage applied to the electrodes of the etching processing device has a frequency of 400 kHz, the laser intensity modulation frequency should be a frequency such as 170 kHz that is different from 400 kHz and the harmonic frequencies thereof such as 800 kHz, 1.2 MHz,. . . .

Figure 16:
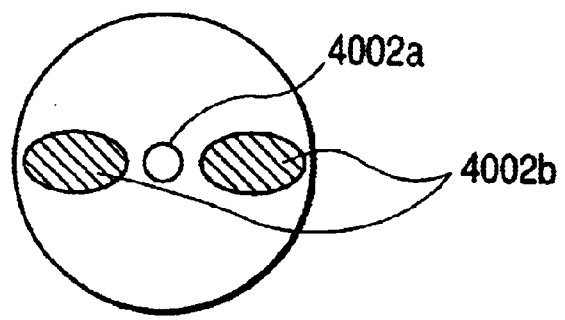
FIG. 16 is a cross-section drawing of a polarization plane retention fiber according to a fourth embodiment of the present invention.
Figure 17:
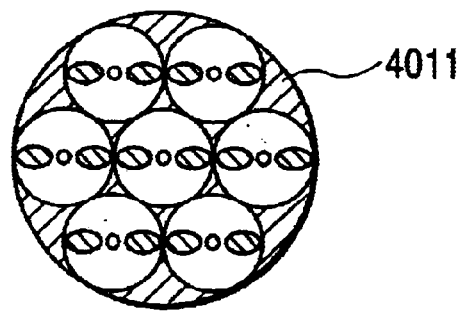
FIG. 17 is a cross-section drawing of a polarization plane retention fiber bundle according to a fourth embodiment of the present invention.
Figure 18:
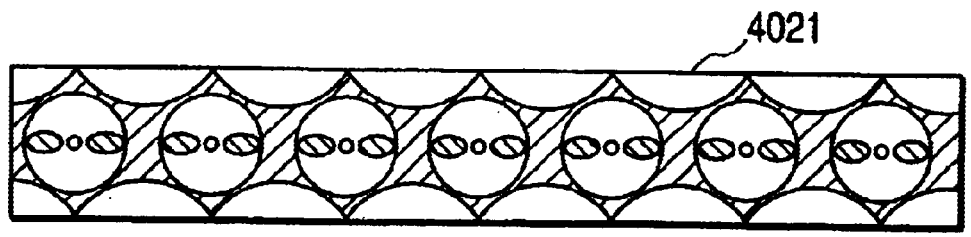
FIG. 18 is a cross-section drawing of a polarization plane retention fiber array according to a fourth embodiment of the present invention.

The intensity-modulated laser light is split seven ways by the beam splitter. In this embodiment, the number of split beams is seven, but the number of split beams is not restricted to seven and can be any number. Each of these split beams is coupled to a polarization plane retention fiber 4002 using a coupling lens. As shown in FIG. 16, the polarization plane retention fibers are formed with stress-applying sections 4002b around a core 4002a. The core 4002 is smaller than those of standard optical fibers (e.g., a few microns for a laser wavelength of 532 nm). A high-power laser beam can result in damage to the entry plane so that the beam is reflected rather than entering the fiber. To prevent this, this embodiment splits the beam and reduces the strength of the split beams to allow them to enter the polarization plane retention fibers. Then, the polarization plane retention fibers are arranged in an array so that the polarization directions of all the exit planes are oriented in the same direction as shown, for example, in FIG. 17 and FIG. 18. The polarization plane retention fiber bundle 4001 then guides the light to the laser illumination/scattered light detection optical system 2002. The laser light entering the laser illumination/scattered light detection optical system 2002 is converted to parallel light by a collimating lens 5005 and is then focused at the center of the wafer W. Next, after the focused laser light is converted to P-polarized light by the half-wave plate 27, it is passed through the polarizing beam splitter 24 at a low loss. The quarter-wave plate 26 then converts this light to a circularly polarized beam 103, which is reflected by the galvano-mirror 25 and guided into the processing chamber through the observation window 10 disposed on a side surface of the plasma processing chamber 86. The galvano-mirror 25 is rotated so that the beam scans a plane parallel to the wafer surface, thus allowing illumination (particle detection) over the entire surface of the wafer. If the beam exiting from the polarization plane retention fiber bundle 4001 is already P-polarized, there is no need for the half-wave plate 27.

The subsequent device architecture and functions provided for signal processing and evaluating contamination generation are similar to the second embodiment described above, so their descriptions will be omitted.

In the embodiment described above, detection is performed for back-scattered light. This allows the laser illumination/scattered light detection optical systems to be formed as a single unit that can be used with processing devices that only have a single observation window 10. In addition, adjustment of optical axes and the like is easier compared to structures in which the illumination optical system and the detection optical system are formed separately, thus allowing the optical system as a whole to be more compact. The excitation light source, which is the element in the illumination light source that is the biggest heat source and that requires a large heat-dissipating heat sink, is separated from the laser illumination/scattered light detection optical system. As a result, the optical system as a whole can be made even more compact.

Also, compared to other elements in the plasma-suspended particle measuring device, the excitation light source has a relatively short lifespan and can be expected to have a high frequency of being replaced. By separating this excitation light source from the laser illumination/scattered light detection optical system, the excitation light source can be replaced directly without having to manipulate the laser illumination/scattered light detection optical system. This improves maintenance efficiency and reduces the downtime of the device.

Also, this embodiment allows a high-power polarized laser beam to be guided to the laser illumination/scattered light detection optical system from outside.

Also, with the modulation/synchronized detection system used in this embodiment, weak particle-scattered light can be separated by wavelength and frequency from plasma emissions, which obstruct the detection of particles in plasma. Thus, compared to conventional methods that only separate by wavelength, the detection sensitivity for particles suspended in plasma can be improved significantly. With the conventional method using wavelength separation only, the minimum detection sensitivity was a diameter of about 1 micron. However, with the method of the present invention, the minimum detection sensitivity can be improved to a diameter of about 0.2 microns, thus allowing stable particle detection for the entire wafer surface.

Also, since this embodiment uses detection of back-scattered light, the illumination beam can be rotationally scanned horizontally, thus allowing the two-dimensional distribution of particles to be easily known.

Also, this embodiment performs particle detection for the entire wafer surface and is able to determine the number, size, and distribution of particles. Thus, the operator can check this information in real time, e.g., through a display.

Since this embodiment allows real-time evaluation of the contamination status within the processing chamber based on the determined number, size, and distribution of particles, it would be possible, for example, to optimize the cleaning schedule and improve the operating efficiency of the device. Also, clustered defects (large numbers of defects being generated all at once) can be prevented, leading to improved yield. Also, since processing proceeds while the contamination status in the processing chamber is continuously monitored, the semiconductor substrates and liquid crystal substrates produced in this manner will be produced in an environment that does not contain more than a predetermined level of particles, thus,providing products with high quality and reliability.

Also, this embodiment can reduce the frequency of evaluations of processing chamber contamination using dummy wafers and contamination status evaluations via random inspections. Thus, the costs involved in the use of dummy wafers can be reduced.

Figure 19:
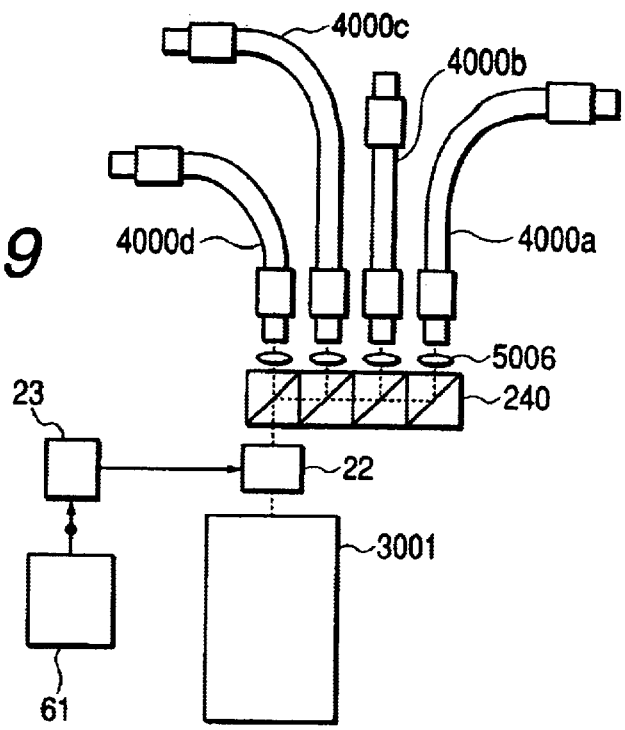
FIG. 19 is a roughly plan drawing showing an external laser light source according to a fifth embodiment of the present invention.

The following is a description of a light source system supplying a laser light source to a laser illumination/scattered light detection optical system in a plasma-suspended particle measuring device according to a fifth embodiment of the present invention, with references to FIG. 19. In this embodiment, the laser beam is split into multiple beams, which are coupled to multiple fiber bundles or to a large-diameter fiber, with the output from the fiber bundles or large-diameter fiber being guided to the laser illumination/scattered light detection optical system 2001 from the second embodiment described above. Since the architecture and functions of the etching processing device equipped with a plasma-suspended particle measuring device are similar to those of the third embodiment described above, corresponding figures and descriptions will be omitted.

First, a laser beam from the laser light source 3001 (e.g., a solid-state laser with a wavelength of 532 nm and an output of up to 500 mW) enters the AO modulator 22. The AO modulator 22 receives a square:wave signal, e.g., with a frequency of 170 kHz preferably with a 50% duty cycle, from the oscillator 23 to provide intensity modulation of the P-polarized beam 101 at that frequency. In this embodiment, where the high-frequency voltage applied to the electrodes of the etching processing device has a frequency of 400 kHz, the laser intensity modulation frequency should be a frequency such as 170 kHz that is different from 400 kHz and the harmonic frequencies thereof such as 800 kHz, 1.2 MHz, . . . . The reason for this is as described in the second embodiment.

The intensity-modulated beam is split four ways by a beam splitter. In this embodiment, the number of split beams is four, but the number of split beams is not restricted to four and can be any number. These split beams are coupled to a fiber bundle 4000a through a fiber bundle 4000d using coupling lenses 5006. These bundled fibers 4000a through 4000d are guided to the laser illumination/scattered light detection optical system 2001 from the second embodiment described above.

The subsequent device architecture and functions provided for signal processing and evaluating contamination generation are similar to the third embodiment described above, so their descriptions and figures will be omitted.

In addition to the advantages provided by the third embodiment described above, this embodiment allows a single laser light source to be used for multiple etching processing devices equipped with plasma-suspended particle measuring devices. This reduces costs.

Figure 20:
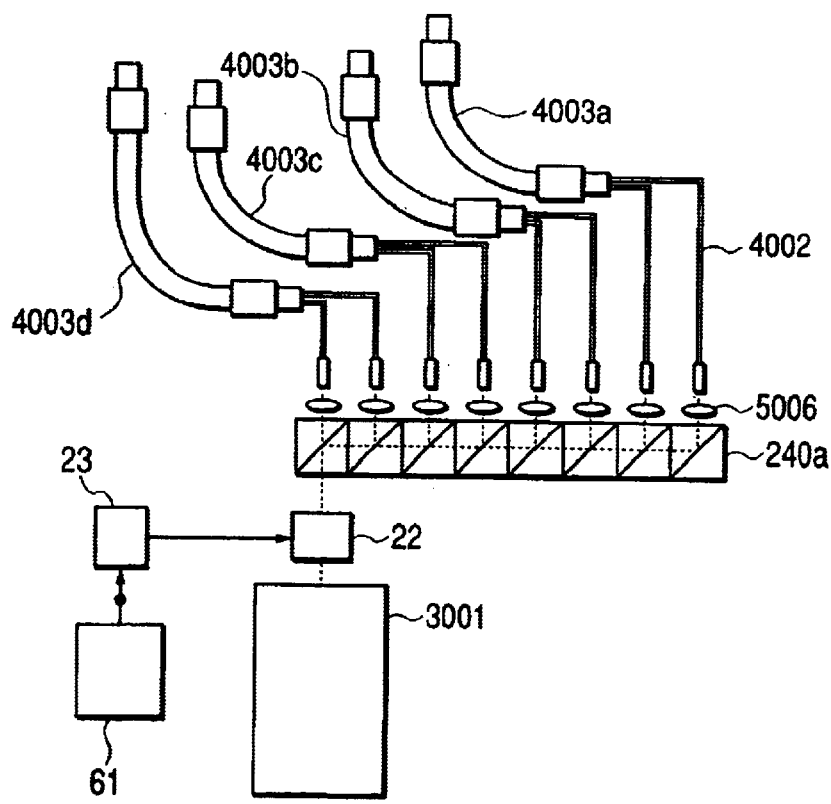
FIG. 20 is a roughly plan drawing showing an external laser light source according to a sixth embodiment of the present invention.

Next, a plasma etching device according to a sixth embodiment of the present invention will be described using FIG. 20. In this embodiment, a laser beam is split into multiple beams, with each beam being coupled to a polarization plane retention fiber. These polarization plane retention fibers are grouped in several sets and bundled so that the polarization directions match at the exit planes. Each of the polarization plane retention fiber bundles are guided to the laser illumination/scattered light detection optical system 2003 from the third embodiment described above. Since the architecture and functions of the etching processing device equipped with a plasma-suspended particle measuring device are similar to those of the fourth embodiment described above, corresponding figures and descriptions will be omitted.

A laser beam from the laser light source 3001 (e.g., a solid-state laser with a wavelength of 532 nm and an output of up to 500 mW) enters the AO modulator 22. The AO modulator 22 receives a square-wave signal, e.g., with a frequency of 170 kHz preferably with a 50% duty cycle, from the oscillator 23 to provide intensity modulation of the P-polarized beam 101 at that frequency. In this embodiment, where the high-frequency voltage applied to the electrodes of the etching processing device has a frequency of 400 kHz, the laser intensity modulation frequency should be a frequency such as 170 kHz that is different from 400 kHz and the harmonic frequencies thereof such as 800 kHz, 1.2 MHz, . . . . The reason for this is as described in the second embodiment.

The intensity-modulated laser light is split eight ways by a beam splitter. In this embodiment, the number of split beams is eight, but the number of split beams is not restricted to eight and can be any number. These split beams are coupled to a polarization plane retention fiber 4002a through a polarization plane retention fiber 4002d using the coupling lenses 5006. Pairs of these fibers are bundled to form four sets of polarization plane retention fiber bundles. In this embodiment, eight polarization plane retention fibers are bundled to form four polarization plane retention fiber bundles, but the number of bundles is not restricted to this. Various combinations can be used. For example, the fibers can be individually guided to the plasma-suspended particle measuring device or the fibers can be divided into two polarization plane retention fiber bundles. Next, the polarization plane retention fiber bundles 4002a through 4002d are guided to the laser illumination/scattered light detection optical system 2002 from the third embodiment described above. The subsequent device architecture and functions provided for signal processing and evaluating contamination generation are similar to the fourth embodiment described above, so their descriptions and figures will be omitted.

In addition to the advantages of the fourth embodiment described above, this embodiment allows a single laser light source to be used for multiple etching processing devices equipped with plasma-suspended particle measuring devices. This reduces costs.

Figure 21:
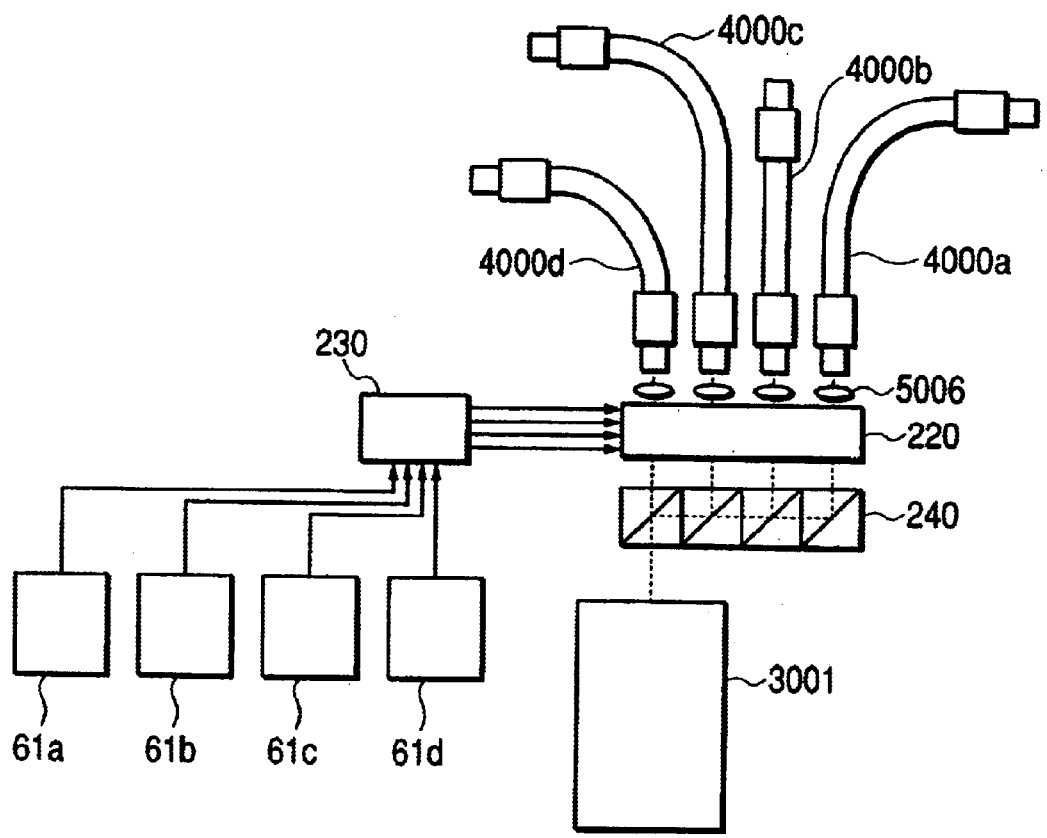
FIG. 21 is a roughly plan drawing showing an external laser light source according to a seventh embodiment of the present invention.
Figure 23A:
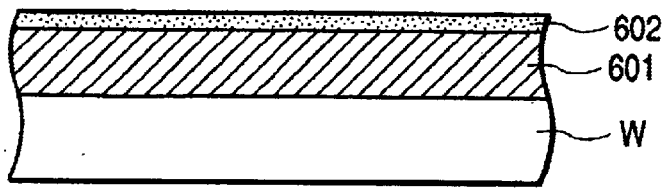
FIG. 23 is a schematic drawing for the purpose of describing with cross-section structures the flow of operations in a contact hole forming process according to an eighth embodiment of the present invention.
Figure 23B:
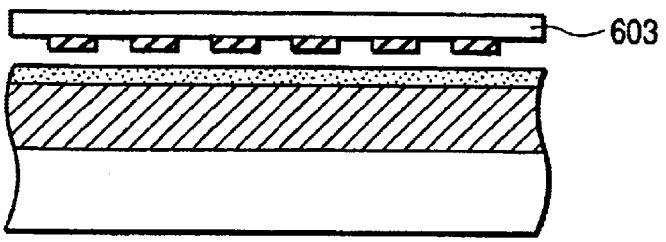
Figure 23C:
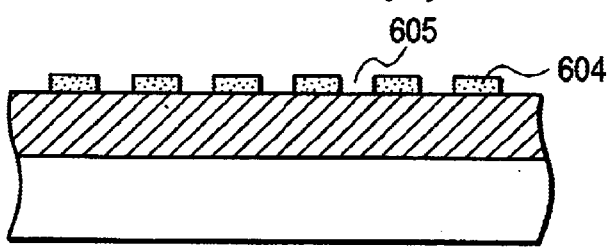
Figure 23D:
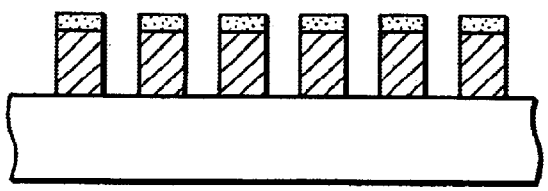
Figure 23E:
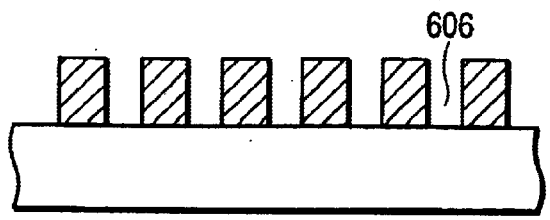

Next, a plasma etching device according to a seventh embodiment of the present invention will be described using FIG. 21. In this embodiment, a laser light is split into multiple beams, each of which is intensity modulated by an AO modulator and coupled with a fiber bundle or large-diameter fiber. The output from the fiber bundles or large-diameter fibers is guided to the laser illumination/scattered light detection optical system 2001 from the third embodiment described above. The subsequent device architecture and functions provided for signal processing and evaluating contamination generation are similar to the third embodiment described above, so their descriptions and figures will be omitted.

A laser beam from the laser light source 3001 (e.g., a solid-state laser with a wavelength of 532 nm and an output of up to 500 mW) is split four ways by a beam splitter. In this embodiment, the number of split beams is four, but the number of split beams is not restricted to four and can be any number. The split beams are sent to a multi-channel AO modulator 220. The AO modulator 220 receives square-wave signals with frequencies output from a computer 61*a* through a computer 61*d* and preferably a duty cycle of 50%. Intensity modulation is performed with these frequencies. These frequencies are set appropriately, taking into account the frequency of the high-frequency voltage applied to the electrodes of the etching processing device. The intensity-modulated beams are coupled to a fiber bundle 4000*a* through a fiber bundle 4000*d* by the coupling lenses 5006. Then, the fiber bundles 4000*a* through 4000*d* are guided to the laser illumination/scattered light detection optical system 2001 from the third embodiment described above. The subsequent device architecture and functions provided for signal processing and evaluating contamination generation are similar to those of the third embodiment described above, so their descriptions will be omitted.

In addition to the advantages provided by the third embodiment through the sixth embodiment, this embodiment as described above allows a multi-functional etching processing device equipped with a plasma-suspended particle measuring device that can use different plasma excitation frequencies.

Figure 24:
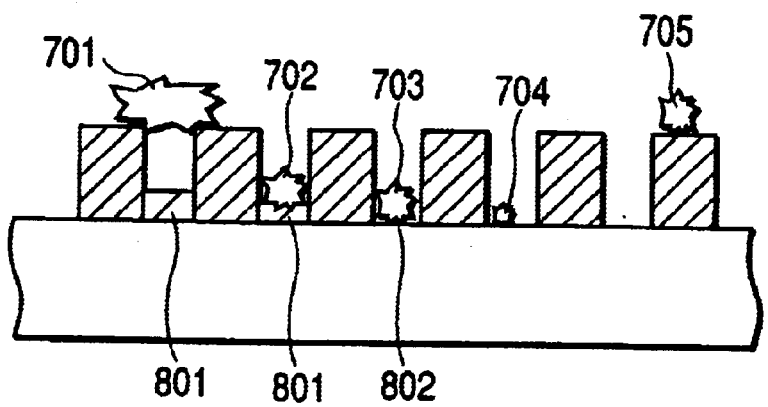
FIG. 24 is a cross-section drawing of a substrate to be processed that schematically shows a defect generated by an adhesed particle in a contact hole etching process according to an eighth embodiment of the present invention.
Figure 25:
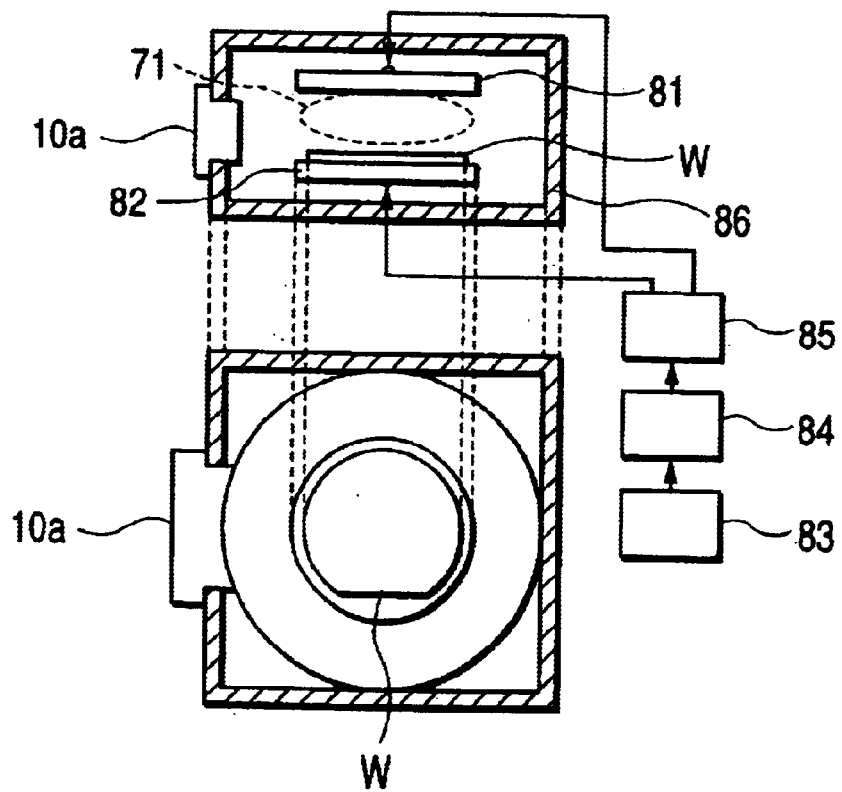
FIG. 25 is a drawing for the purpose of describing a flat, parallel-plate plasma etching device according to a conventional technology.

Next, an eighth embodiment of the present invention will be described using FIG. 22, FIG. 23, and FIG. 24. Also, an overview of a method for producing semiconductor integrated circuit devices according to the present invention will be described using FIG. 22 and FIG. 23.

Step 1001 is a film forming step in which a film 601 such as a silicon oxide film is formed on the wafer W. Step 1002 is a film thickness measuring step for inspecting the thickness of the film that was formed. Step 1003 is a resist applying step, in which a resist 602 is applied to the wafer W. Step 1004 is a pattern transfer step for transferring a mask pattern 603 to the wafer. Step 1005 is a developing step that eliminates the resist over the sections to be processed. Step 1006 is an etching step, where resist removal sections 605 of the film 601 is etched using the resist pattern 604 as a mask, thus forming circuit grooves and contact holes 606. Step 1007 is an ashing step that removes the resist pattern 604. Step 1008 is a cleaning step for cleaning the surface and back surface of the wafer. This series of steps is used, for example, to form contact holes.

In standard semiconductor integrated circuit devices, this series of steps is repeated to form a multi-layer structure.

Next, using FIG. 24, defects created by the adhesion to the wafer of particles generated during etching will be described. FIG. 24 shows an example in which defects are generated when contact holes are etched.

A particle 701 indicates a particle adhered to a contact hole opening during the etching operation. In this case, the adhesed particle stops the etching reaction. This closes off the contact hole where the particle is attached, resulting in a critical defect.

A particle 702 indicates a particle adhered inside a contact hole during the etching operation. The etching reaction is stopped in this case as well due to the adhesion of the particle. This closes off the contact hole where the particle is attached, resulting in a critical defect.

A particle 703 and a particle 704 indicate particles adhered inside contact holes after the etching operation is finished. In places such as contact holes that have high aspect ratios, particles can often be difficult to remove through cleaning. If the particle is large, as in the particle 703, a bad contact may result, causing a critical defect.

A particle 705 indicates a particle adhered to the resist pattern 604 during etching. In this case, the adhesed particle 705 does not affect the etching reaction at all. Thus, the adhesed particle 705 will not lead to a critical defect.

In this manner, the adhesion of a particle will not lead to a critical defect if the size of the particle is not large enough to lead to a defect or if the position of the particle is a non-etching region. Thus, even if particles are adhered to the wafer, not all of them will lead to critical defects. Also, while the particle 701 and the particle 705 are particles that can be easily cleaned off, removal through cleaning is difficult for particles that have dropped into a contact hole having a high aspect ratio, e.g., the particle 602, the particle 703, and the particle 704.

In the present invention, a plasma-suspended particle measuring device 1100 is used at the etching step 1006 to detect in real time the particles generated in the processing chamber during etching. Based on these particle detection results, a decision is made on whether to send the processed wafer to the next step and continue processing the remaining wafers, whether to perform a visual inspection before sending the wafer to the next step, or whether to stop processing and perform cleaning (maintenance) of the processing chamber.

In this case, the sizes and quantity of the detected particles are compared with predetermined reference values (particle management references) to determine the next operation to be performed.

Next, an example of a method for calculating these reference values (particle management references) according to this embodiment will be described. As already described, the adhesion of particles on the wafer does not mean that all of these particles will lead to critical defects. The possibility that an adhesed particle will lead to a critical defect can be determined by calculations based on the relationship between the numerical aperture of the pattern, pattern density, circuit pattern width, and the like, and the sizes and quantity of the adhesed particles. By performing prior testing to determine the correlation between the sizes and quantity of the particles detected during the etching operation and the sizes and quantity of the particles adhered to the wafer, the probability that particles detected during etching will lead to critical defects can be determined.

The reference values (particle management references) are determined based on values obtained using these means. The following is an example of how reference values are set up in this embodiment.

A reference value 1 is set so that if the number of detected particles having a size no less than a certain size is less than the reference value 1, the probability of a critical defect is very low (e.g., a critical defect generation probability of no more than 1%). For example, the reference value 1 can be set to 10 for particle diameters of at least 0.4 microns.

A reference value 2 is set so that if the number of detected particles having a size no less than a certain size is at or greater than the reference value 1 and less than the reference value 2, then the possibility of a critical defect is a concern (e.g., a critical defect generation probability of no more than 5%). For example, the reference value 2 can be set to 30 for particle diameters of at least 0.4 microns.

If the detected particles having a size no less than a certain size and a quantity at or greater than the reference value 2, multiple critical defects may be generated (e.g., a critical defect generation probability of 5% or higher).

Based on these reference values, if the number of particles detected during etching that have a size no less than a certain size is less than the reference value 1, the probability that a critical defect being generated is low, so the next wafer can be processed.

If the number of particles detected during etching that have a size no less than a certain size is at least the reference value 1 but less than the reference value 2, a visual inspection is performed after the etching operation is completed. If no critical defects are found as a result of the visual inspection, the wafer is sent to the following ashing step 1007. If the visual inspection results in a critical defect being found, the critical defect is evaluated to see if it is a recoverable defect or not. If this evaluation indicates that the defect is recoverable (e.g., use of the recovered circuit), the wafer is sent to the next ashing step 1007. If this evaluation determines that the defect is not recoverable, the defect position is recorded and the wafer is sent to the next ashing step 1007. Then, when the individual chips are being cut out by dicing, for example, the chip containing the unrecoverable defect is thrown-out.

If the number of particles detected during etching that have a size no less than a certain size is greater than the reference value 2, the wafer which is to undergo further processing is likely to generate a large number of critical defects. Thus, a display on the monitor or an alarm is used to notify the operator of the etching device so that the etching operation is stopped and cleaning (maintenance) is carried out in the plasma processing chamber. With etching processing devices not equipped with a device for measuring particles suspended in plasma, cleaning of the processing chamber is not necessarily carried out at appropriate times. Thus, cleaning may be performed at times when there is no need, thus reducing the availability of the device. Conversely, the device may continue processing even though the time to perform cleaning has passed, thus generating large numbers of defects and reducing yield.

There is also a method for determining cleaning times by using a dummy wafer beforehand to check for particles in the processing chamber. This inserts an extra operation in the series of production steps and reduces throughput while adding the cost of the dummy wafers. As the diameter of wafers increase, the cost of dummy wafers will necessarily increase. Also, the need to reduce preparatory operations using dummy wafers to check for particles in the processing chamber has been a significant issue.

With this embodiment, wafer processing can be performed while also performing real-time monitoring of the contamination status inside the processing chamber. This allows cleaning times to be optimized and eliminates the need for preparatory operations using dummy wafers. As a result, throughput is increased and the cost of dummy wafers is eliminated. Also, products produced using the steps of this embodiment are high-quality products with a particle content no greater than a reference value. This allows highly reliable products to be produced.

In the above embodiment, an implementation for an etching processing device was described. However, as noted earlier, the implementation of the present invention is not limited to this. For example, the present invention can be implemented for ashing devices and film forming devices to allow real-time monitoring of particles in ashing devices and film forming devices. This can reduce defects occurring in film forming steps and ashing steps within photolithography operations, thus preventing defects and improving yield.

With the present invention as described above, the use of back-scattered light detection allows the laser illumination/scattered light detection optical systems to be formed as a single unit that can be used on a processing device that only has one observation window. In addition, adjustment of optical axes and the like is easier compared to structures in which the illumination optical system and the detection optical system are formed separately, thus allowing the optical system as a whole to be more compact.

Also, the excitation light source, which is the element in the illumination light source that is the biggest heat source and that requires a large heat-dissipating heat sink, is separated from the laser illumination/scattered light detection optical system. As a result, the optical system as a whole can be made even more compact.

Also, compared to other elements in the plasma-suspended particle measuring device, the excitation light source has a relatively short lifespan and can be expected to have a high frequency of being replaced. By separating this excitation light source from the laser illumination/scattered light detection optical system, the excitation light source can be replaced directly without having to manipulate the laser illumination/scattered light detection optical system. This improves maintenance efficiency and reduces the downtime of the device.

Also, with the modulation/synchronized detection system used in the present invention, weak particle-scattered light can be separated by wavelength and frequency from plasma emissions, which obstruct the detection of particles in plasma. Thus, compared to conventional methods that only separate by wavelength, the detection sensitivity for particles suspended in plasma can be improved significantly. With the conventional method using wavelength separation only, the minimum detection sensitivity was a diameter of about 1 micron. However, with the method of the present invention, the minimum detection sensitivity can be improved to a diameter of about 0.2 microns, thus allowing stable particle detection for the entire wafer surface.

Also, since the present invention uses detection of back-scattered light, the illumination beam can be rotationally scanned horizontally, thus allowing the two-dimensional distribution of particles to be easily known.

Also, the present invention performs particle detection for the entire wafer surface and is able to determine the number, size, and distribution of particles. Thus, the operator can check this information in real time, e.g., through a display.

Since the present invention allows real-time evaluation of the contamination status within the processing chamber based on the determined number, size, and distribution of particles, it would be possible, for example, to optimize the cleaning schedule and improve the operating efficiency of the device. Also, clustered defects (large numbers of defects being generated all at once) can be prevented, leading to improved yield. Also, since processing proceeds while the contamination status in the processing chamber is continuously monitored, the semiconductor substrates and liquid crystal substrates produced in this manner will be produced in an environment that does not contain more than a predetermined level of particles, thus providing products with high quality and reliability.

Also, this embodiment can reduce the frequency of evaluations of processing chamber contamination using dummy wafers and contamination status evaluations via random inspections. Thus, the costs involved in the use of dummy wafers can be reduced.

These advantages allow the contamination status inside the etching device processing chamber to be monitored in real time. As a result, wafer defects resulting from adhesed particles can be reduced so that high-quality semiconductor elements can be produced, and the timing at which the device should be cleaned can be determined accurately.

Also, the frequency of pre-checking operations using dummy wafers can be reduced, thus reducing costs and improving production efficiency. This also allows automation of the production line.

The invention may be embodied in other specific forms without departing from the spirit or essential characteristics thereof. The present embodiment is therefor to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A device for detecting particles suspended in a device for processing semiconductor devices comprising:
    a laser light source module outputting a laser;
    a laser illumination optical system receiving a laser emitted by said laser light source and scanning a laser to illuminate inside said device for processing semiconductor devices;
    a scattered light detection optical system detecting a laser scattered by a particle suspended inside said device for processing semiconductor devices and illuminated by said scanning performed by said laser illumination optical system; and
    a signal processing module processing a detection signal from said scattered light detection optical system and outputting information relating to said particle suspended in said device for processing semiconductor devices;
    wherein said laser light source module and said laser illumination optical system are connected by an optical fiber.

2. A device as claimed in claim 1, wherein said laser illumination optical system and said scattered light detection optical system are formed as a single unit.

3. A device as claimed in claim 1, wherein said laser light source module includes a heat sink.

4. A device as claimed in claim 1, wherein said scattered light detection optical system includes a light blocker for blocking light reflected from inner wall surfaces of said device for processing semiconductor devices.

5. A device as claimed in claim 1, wherein said scanned laser illuminating inside said device for processing semiconductor devices is intensity modulated at a desired frequency.

6. A device as claimed in claim 1, wherein said signal processing module outputs information about quantity, sizes, and distribution of particles suspended inside said device for processing semiconductor devices.

7. A device for detecting particles suspended in a processing chamber for processing semiconductor devices, comprising:
    a laser light source module for outputting a laser;
    a monitoring optical system for receiving a laser emitted by said laser light source, scanning a laser to illuminate inside said processing chamber, and detecting scattered light scattered by a particle suspended inside said processing chamber; and
    a signal processing module for processing a detection signal from said monitoring optical system detecting said scattered light;
    wherein said monitoring optical system is connected to said laser light source module and said signal processing module by optical fibers.

8. A device as claimed in claim 7, wherein said laser light source module outputs an excitation laser and said excitation laser output from said laser light source module excites a laser from said monitoring optical system that illuminates inside said processing chamber.

9. A device as claimed in claim 7, wherein said monitoring optical system can be attached to and removed from an observation window of said processing chamber.

10. A device as claimed in claim 7, wherein said signal processing module outputs information about quantity, sizes, and distribution of particles suspended inside said processing chamber.

11. A device as claimed in claim 7, wherein said monitoring optical system illuminates circularly polarized light inside said processing chamber.

12. A device as claimed in claim 7, wherein said monitoring optical system detects light scattered by particles suspended inside said processing chamber while blocking light illuminated in said processing chamber and reflected from inner wall surfaces of said processing chamber.

13. A device as claimed in claim 7, wherein said laser light source module includes a heat sink.

14. A device as claimed in claim 7, wherein said scanning laser illuminating inside said processing chamber is intensity modulated at a desired frequency.

15. A device for processing semiconductor devices comprising:
    a processing chamber having an observation window allowing observation inside said processing chamber, a mounting module for mounting a substrate to be processed in said processing chamber, and a pressure setting module for maintaining a predetermined pressure inside said processing chamber;
    plasma processing means for processing plasma inside said processing chamber in which said predetermined pressure is maintained, and processing said substrate mounted on said mounting module;
    a laser light source module disposed outside of said processing chamber;
    a laser illumination optical system for receiving a laser emitted by said laser light source by way of an optical fiber, and scanning a laser through said observation window to illuminate inside said processing chamber;
    a scattered light detection optical system for detecting, through said observation window, scattered light scattered by a particle suspended inside said processing chamber and illuminated by said scanning performed by said laser illumination optical system, while said plasma processing means is processing said substrate mounted on said mounting module; and
    a signal processing module for receiving and processing, by way of an optical fiber, a detection signal from said scattered light detection optical system, and outputting information relating to said particle suspended in said processing chamber.

16. A device as claimed in claim 15, wherein said laser light source module outputs an excitation laser and said excitation laser output from said laser light source module excites a laser from said laser illumination optical system that illuminates inside processing chamber.

17. A device as claimed in claim 15, wherein said laser illumination optical system and said scattered light detection optical system are formed as a single unit.

18. A device as claimed in claim 15, wherein said laser light source module includes a heat sink.

19. A device as claimed in claim 15, wherein said scattered light detection optical system includes a light blocker for blocking light reflected from inner wall surfaces of said processing chamber.

20. A device as claimed in claim 15, wherein said signal processing module outputs information about quantity, sizes, and distribution of particles suspended inside said processing chamber.

21. A device for processing semiconductor devices comprising:

a processing chamber having an observation window allowing observation inside said processing chamber, a mounting module for mounting a substrate to be processed in said processing chamber, and a pressure setting module for maintaining a predetermined pressure inside said processing chamber;

means for processing plasma inside said processing chamber in which said predetermined pressure is maintained, and processing said substrate mounted on said mounting module;

a laser light source module disposed outside of said processing chamber;

a monitoring optical system for receiving a laser emitted by said laser light source by way of an optical fiber, scanning a laser through said observation window to illuminate inside said processing chamber, and detecting, through said observation window, scattered light scattered by a particle suspended inside said processing chamber in which said plasma processing means is processing said substrate mounted on said mounting module and illuminated by said scanning performed by said laser illumination optical system; and a signal processing module for receiving and processing, by way of an optical fiber, a detection signal from said scattered light detection optical system, and outputting information relating to said particle suspended in said processing chamber.

22. A device as claimed in claim 21, wherein said laser light source module outputs an excitation laser and said excitation laser output from said laser light source module excites a laser from said monitoring optical system that illuminates inside said processing chamber.

23. A device as claimed in claim 21, wherein said monitoring optical system can be attached to and removed from said observation window of said processing chamber.

24. A device as claimed in claim 21, wherein said monitoring optical system detects light scattered by particles suspended inside said processing chamber, while blocking light illuminated in said processing chamber and reflected from inner wall surfaces of said processing chamber.

25. A device as claimed in claim 21, wherein said laser light source module includes a heat sink.

26. A device as claimed in claim 21, wherein said signal processing module outputs information about quantity, sizes, and distribution of particles suspended inside said processing chamber.

* * * * *